United States Patent
Callahan et al.

(10) Patent No.: US 8,441,325 B2
(45) Date of Patent: May 14, 2013

(54) ISOLATOR WITH COMPLEMENTARY CONFIGURABLE MEMORY

(75) Inventors: Phil A. Callahan, Austin, TX (US); Ahsan Javed, Austin, TX (US); Zhiwei Dong, Austin, TX (US); Axel Thomsen, Austin, TX (US); Donald E. Alfano, Austin, TX (US); Timothy Dupuis, Austin, TX (US); Ka Y. Leung, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 937 days.

(21) Appl. No.: 12/494,618

(22) Filed: Jun. 30, 2009

(65) Prior Publication Data
US 2010/0052826 A1 Mar. 4, 2010

Related U.S. Application Data

(63) Continuation-in-part of application No. 12/060,049, filed on Mar. 31, 2008, now Pat. No. 8,169,108, which is a continuation-in-part of application No. 11/772,178, filed on Jun. 30, 2007, now Pat. No. 8,049,573, which is a continuation-in-part of application No. 11/089,348, filed on Mar. 24, 2005, now Pat. No. 7,302,247, which is a continuation-in-part of application No. 10/860,399, filed on Jun. 3, 2004, now Pat. No. 7,421,028, said application No. 12/060,049 is a continuation-in-part of application No. 10/860,519, filed on Jun. 3, 2004, now Pat. No. 7,447,492, and a continuation-in-part of application No. 11/020,977, filed on Dec. 22, 2004, now Pat. No. 7,376,212, and a continuation-in-part of application No. 11/064,413, filed on Feb. 23, 2005, now Pat. No. 7,460,604.

(51) Int. Cl.
*H03H 2/00* (2006.01)
*H04B 3/00* (2006.01)

(52) U.S. Cl.
USPC .................. 333/24 R; 375/258; 455/292

(58) Field of Classification Search ............ 333/1, 24 R; 375/258; 455/292, 333
See application file for complete search history.

(56) References Cited

U.S. PATENT DOCUMENTS
3,058,078 A 10/1962 Hoh
(Continued)

FOREIGN PATENT DOCUMENTS
DE 10100282 A1 7/2002
FR 2679670 A1 1/1993
(Continued)

OTHER PUBLICATIONS
"Publications—Geoff Walker", http://www.itee.uq.edu.au/~walkerg/publications/pubs_grw_links.html, May 2007.
(Continued)

*Primary Examiner* — Dean O Takaoka
*Assistant Examiner* — Alan Wong
(74) *Attorney, Agent, or Firm* — Trop, Pruner & Hu, P.C.

(57) ABSTRACT

An isolator that includes first and second substantially identical circuitry galvanically isolated from each other and each having at least one communications channel thereon for communicating signals across an isolation boundary therebetween and each of said first and second circuitry having configurable functionality associated with the operation thereof. A coupling device is provided for coupling signal across the isolation boundary between the at least one communication channels of the first and second circuitry. First and second configuration memories are provided, each associated with a respective one of the first and second circuitry. First and second configuration control devices are provided, each associated with a respective one of the first and second circuitry and each configuring the functionality of the associated one of the first and second circuitry. The first and second configurable memories have stored therein complementary configuration information to control each of the functionalities of the first and second circuitry to operate in a complementary manner for communication of signals across the isolation boundary.

20 Claims, 14 Drawing Sheets

U.S. PATENT DOCUMENTS

| | | |
|---|---|---|
| 3,537,022 A | 10/1970 | Regan |
| 3,713,148 A | 1/1973 | Cardullo et al. |
| 3,714,540 A | 1/1973 | Galloway |
| 3,760,198 A | 9/1973 | Mori et al. |
| 3,798,608 A | 3/1974 | Huebner |
| 3,859,624 A | 1/1975 | Kriofsky et al. |
| 4,024,452 A | 5/1977 | Seidel |
| 4,027,152 A | 5/1977 | Brown et al. |
| 4,118,603 A | 10/1978 | Humhyr |
| 4,227,045 A | 10/1980 | Chelcun et al. |
| 4,302,807 A | 11/1981 | Mentler |
| 4,425,647 A | 1/1984 | Collins et al. |
| 4,459,591 A | 7/1984 | Haubner et al. |
| 4,523,128 A | 6/1985 | Stamm et al. |
| 4,536,715 A | 8/1985 | Basarath et al. |
| 4,538,136 A | 8/1985 | Drabing |
| 4,547,961 A | 10/1985 | Bokil et al. |
| 4,584,708 A | 4/1986 | Eilers et al. |
| 4,650,981 A | 3/1987 | Foletta |
| 4,675,579 A | 6/1987 | Hardy et al. |
| 4,703,283 A | 10/1987 | Samuels |
| 4,748,419 A | 5/1988 | Somerville |
| 4,763,075 A | 8/1988 | Weigert |
| 4,780,795 A | 10/1988 | Meinel |
| 4,785,345 A | 11/1988 | Rawls et al. |
| 4,791,326 A | 12/1988 | Vajdic et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,853,654 A | 8/1989 | Sakurai |
| 4,859,877 A | 8/1989 | Cooperman et al. |
| 4,868,647 A | 9/1989 | Uehara et al. |
| 4,885,582 A | 12/1989 | LaBarge et al. |
| 4,922,883 A | 5/1990 | Iwasaki |
| 4,924,210 A | 5/1990 | Matsui et al. |
| 4,931,867 A | 6/1990 | Kikuchi |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,128,729 A | 7/1992 | Alonas et al. |
| 5,142,432 A | 8/1992 | Schneider |
| 5,164,621 A | 11/1992 | Miyamoto et al. |
| 5,168,863 A | 12/1992 | Kurtzer |
| 5,204,551 A | 4/1993 | Bjornholt |
| 5,270,882 A | 12/1993 | Jove et al. |
| 5,293,400 A | 3/1994 | Monod et al. |
| 5,369,666 A | 11/1994 | Folwell et al. |
| 5,384,808 A | 1/1995 | Van Brunt et al. |
| 5,396,394 A | 3/1995 | Gee |
| 5,404,545 A | 4/1995 | Melvin |
| 5,418,933 A | 5/1995 | Kimura et al. |
| 5,424,709 A | 6/1995 | Tal |
| 5,434,886 A | 7/1995 | Kazawa et al. |
| 5,442,303 A | 8/1995 | Asada et al. |
| 5,444,740 A | 8/1995 | Mizukami et al. |
| 5,448,469 A | 9/1995 | Rilly et al. |
| 5,467,607 A | 11/1995 | Harvey |
| 5,469,098 A | 11/1995 | Johnson, Jr. |
| 5,484,012 A | 1/1996 | Hiratsuka |
| 5,533,054 A | 7/1996 | DeAndrea et al. |
| 5,539,598 A | 7/1996 | Denison et al. |
| 5,544,120 A | 8/1996 | Kuwagata et al. |
| 5,555,421 A | 9/1996 | Enzinna |
| 5,572,179 A | 11/1996 | Ito et al. |
| 5,588,021 A | 12/1996 | Hunt et al. |
| 5,591,966 A | 1/1997 | Harada et al. |
| 5,596,466 A | 1/1997 | Ochi |
| 5,615,091 A | 3/1997 | Palatnik |
| 5,615,229 A | 3/1997 | Sharma et al. |
| 5,625,265 A | 4/1997 | Vlahu |
| 5,627,480 A | 5/1997 | Young et al. |
| 5,627,488 A | 5/1997 | Tanzawa et al. |
| 5,650,357 A | 7/1997 | Dobkin et al. |
| 5,654,984 A | 8/1997 | Hershbarger et al. |
| 5,663,672 A | 9/1997 | Nuechterlein |
| 5,701,037 A | 12/1997 | Weber et al. |
| 5,714,938 A | 2/1998 | Schwabl |
| 5,716,323 A | 2/1998 | Lee |
| 5,731,727 A | 3/1998 | Iwamoto et al. |
| 5,731,954 A | 3/1998 | Cheon |
| 5,774,791 A | 6/1998 | Strohallen et al. |
| 5,781,071 A | 7/1998 | Kusunoki |
| 5,781,077 A | 7/1998 | Leitch et al. |
| 5,786,763 A | 7/1998 | Canipe |
| 5,786,979 A | 7/1998 | Douglas |
| 5,789,960 A | 8/1998 | Bower |
| 5,801,602 A | 9/1998 | Fawal et al. |
| 5,812,597 A | 9/1998 | Graham et al. |
| 5,812,598 A | 9/1998 | Sharma et al. |
| 5,825,259 A | 10/1998 | Harpham et al. |
| 5,831,426 A | 11/1998 | Black, Jr. et al. |
| 5,831,525 A | 11/1998 | Harvey |
| 5,845,190 A | 12/1998 | Bushue et al. |
| 5,850,436 A | 12/1998 | Rosen et al. |
| 5,864,607 A | 1/1999 | Rosen et al. |
| 5,900,683 A | 5/1999 | Rinehart et al. |
| 5,907,481 A | 5/1999 | Svardsjo |
| 5,913,817 A | 6/1999 | Lee |
| 5,926,358 A | 7/1999 | Dobkin et al. |
| 5,945,728 A | 8/1999 | Dobkin et al. |
| 5,952,849 A | 9/1999 | Haigh |
| 5,969,590 A | 10/1999 | Gutierrez |
| 6,023,202 A * | 2/2000 | Hill .............................. 333/24 C |
| 6,049,258 A | 4/2000 | Fawal et al. |
| 6,054,780 A | 4/2000 | Haigh et al. |
| 6,061,009 A | 5/2000 | Krone et al. |
| 6,069,802 A | 5/2000 | Priegnitz |
| 6,082,744 A | 7/2000 | Allinger et al. |
| 6,087,882 A | 7/2000 | Chen et al. |
| 6,104,003 A | 8/2000 | Jones |
| 6,114,937 A | 9/2000 | Burghartz et al. |
| 6,124,756 A | 9/2000 | Yaklin et al. |
| 6,137,372 A | 10/2000 | Welland |
| 6,222,922 B1 | 4/2001 | Scott et al. |
| 6,232,902 B1 | 5/2001 | Wada |
| 6,249,171 B1 | 6/2001 | Yaklin et al. |
| 6,262,600 B1 | 7/2001 | Haigh et al. |
| 6,291,907 B1 | 9/2001 | Haigh et al. |
| 6,307,497 B1 | 10/2001 | Leung et al. |
| 6,384,763 B1 | 5/2002 | Leung et al. |
| 6,389,063 B1 | 5/2002 | Kanekawa et al. |
| 6,452,519 B1 | 9/2002 | Swanson |
| 6,525,566 B2 | 2/2003 | Haigh et al. |
| 6,538,136 B1 | 3/2003 | Rizzo et al. |
| 6,603,807 B1 | 8/2003 | Yukutake et al. |
| 6,611,051 B2 | 8/2003 | Akiyama et al. |
| 6,670,861 B1 | 12/2003 | Balboni |
| 6,720,816 B2 | 4/2004 | Strzalkowski |
| 6,728,320 B1 | 4/2004 | Khasnis et al. |
| 6,747,522 B2 | 6/2004 | Pietruszynski et al. |
| 6,833,800 B1 | 12/2004 | Patterson |
| 6,873,065 B2 | 3/2005 | Haigh et al. |
| 6,902,967 B2 | 6/2005 | Beasom |
| 6,903,578 B2 | 6/2005 | Haigh et al. |
| 6,914,547 B1 | 7/2005 | Swaroop et al. |
| 6,922,080 B2 | 7/2005 | Haigh et al. |
| 6,927,662 B2 | 8/2005 | Kahlmann et al. |
| 6,940,445 B2 | 9/2005 | Kearney |
| 6,956,727 B1 | 10/2005 | Brokaw |
| 6,967,513 B1 | 11/2005 | Balboni |
| 6,977,522 B1 | 12/2005 | Murabayashi et al. |
| 7,012,388 B2 | 3/2006 | Lin et al. |
| 7,016,490 B2 | 3/2006 | Beutler et al. |
| 7,023,372 B1 | 4/2006 | Singh et al. |
| 7,053,807 B1 | 5/2006 | Gaalaas |
| 7,053,831 B2 | 5/2006 | Dempsey et al. |
| 7,057,491 B2 | 6/2006 | Dempsey |
| 7,075,329 B2 | 7/2006 | Chen et al. |
| 7,102,388 B2 | 9/2006 | Murabayashi et al. |
| 7,277,491 B2 | 10/2007 | Dong et al. |

| | | | |
|---|---|---|---|
| 7,315,592 | B2 | 1/2008 | Tsatsanis et al. |
| 7,940,921 | B2 * | 5/2011 | Bark et al. ............... 379/390.01 |
| 8,044,747 | B2 * | 10/2011 | Yu et al. ...................... 333/24 R |

FOREIGN PATENT DOCUMENTS

| | | |
|---|---|---|
| GB | 2173956 A1 | 10/1986 |
| JP | 57-132460 A1 | 8/1982 |
| JP | 2000-174666 | 6/2000 |
| WO | WO99/21332 A1 | 4/1999 |
| WO | 03/050376 | 6/2003 |

OTHER PUBLICATIONS

A Tale of Two Modems, Sensors Magazine, Apr. 2002, pp. 30-32.
Akiyama, Noboru, A High-Voltage Monolithic Isolator for a Communication Network Interface, IEEE Transactions on Electron Devices, May 2002, pp. 895-901, Vol. 49, No. 5.
Analog Devices—ADuM130x/ADuM140x; Coupler Technology Removes the Limitations of Optocoupler Solutions, pp. 2-15, May 2003.
Baker, Bonnie C., The Basics of Isolation Circuits, Sensors and Systems, May 1996, pp. 46-47.
Bindra, Ashok, MEMS-Based Magnetic Coils Exceed the Limitations of Optical Couplers, Electronic Design, Jul. 24, 2000, p. 43.
Bourgeois, J.M., "PCB-based Transformer for Power MOSFET Drive," 0-7803-1456-5-94 at pp. 283-244, IEEE, 1994.
Choina, Simon, Planar Transformers Make Maximum Use of Precious Board Space, Electronic Design, Mar. 9, 1999, pp. 97 & 99.
Clark, Ron, RS-232C/422/485 Line Isolation Solves More Than Fault Problems, EDN, Sep. 28, 1995, pp. 103-115.
EDN'S 100 Top Products 1994, EDN, Dec. 8, 1994, pp. 58.
Green, M.W. Miniature Multilayer Spiral Inductors for GsAs MMICs, 1989 IEEE GaAs Symposium, 1989, pp. 303-306.
Hoskins, Kevin, Isolated ADC Reduces Power Consumption, EDN, Mar. 30, 1995, pp. 73-74.
Ichio Aoki et al.; Fully Integrated CMOS Power Amplifier Design Using the Distributed Active-Transformer Architecture; IEEE Journal of Solid State Circuits, vol. 37, No. 3, Mar. 2002; pp. 371-383.
IEEE Standard for a High Performance Serial Bus, IEEE Std. 1395-1995, Dec. 1995, pp. 1-392, NY.
Impedance Matching Transformers, Transformer Applications, pp. 72-85, 2001.
Kester, W., Origins of Real-World Signals and Their Units Measurement, ch. 1, pp. 1.1-1.11, 2003.
Kilger, R. et al., "Micromachined magnetics: a new step in the evolution of isolation technology," Electronic Engineering, Jun. 2000 at pp. 27-32.
Klein William, Applications of Signal Isolation, Sensors Magazine, Apr. 2000, pp. 70-74.
Knoedl, G., A Monolithic Signal Isolator, IEEE, 1989, pp. 165-170.
Kojima, Yasuyuki, 2.3 kVac 100 MHz Multi-Channel Monolithic Isolator IC, 2000 Proceedings Annual IEEE International ASIC Conference, 2000, pp. 309-312.
Kojima, Yasuyuki, A Novel Monolithic Isolator for a Communications Network Interface IC, 1998 Proceedings Annual IEEE International ASIC Conference, 1998, pp. 255-258.
Kuhn, William, An RF-Based IEEE 1394 Ground Isolator Designed in a Silicon-on-Insulator Process, 44th IEEE 2001 Midwest Symposium on Circuits and Systems, Aug. 2001, pp. 764-767.
Lam, Sam, High-Isolation Bonding Pad Design for Silicon RFIC up to 20 GHz, IEEE Electron Device Letters, Sep. 2003, vol. 24, No. 5, pp. 601-603.
Long, John R., A 1.9 GHz Low-Voltage Silicon Bipolar Receiver Front-End for Wireless Personal Communications Systems, IEEE Journal of Solid-State Circuits, Dec. 1995, vol. 30, No. 12, pp. 1438-1448.
Long, John R., Monolithic Transformers for Silicon RF IC Design, IEEE Journal of Solid-State Circuits, Sep. 2000, vol. 35, No. 9, pp. 1368-1382.
Mammano, Bob, Isolated Power Conversion: making the case for secondary-side control, EDN, Jun. 7, 2001, pp. 123-127.
Martel, Jesus, Analysis of a Microstrip Crossover Embedded in a Multilayered Anisotropic and Lossy Media, IEEE Transactions on Microwave Theory and Techniques, March 1994, pp. 424-432, vol. 32, No. 3.
Munzer, M., Coreless transformer a new technology for half bridge driver IC's, pp. 1-4, 2000.
Pickering, Paul, A System Designer's Guide to Isolation Devices, Sensors, Jan. 1999, pp. 14-26.
Ronkainen, H., IC compatible planar inductors on silicon, IEE Proc.-Circuits Devices Syst., Feb. 1997, vol. 144, No. 1, pp. 29-35.
Schweber, Bill, MEMS-Based Digital Isolator Answers Need for Extreme I/O Speed, EDN, Jul. 20, 2000, p. 24.
Schweher, Bill, DAAs go for the Silicon, EDN, Feb. 17, 2000, pp. 119-130.
Simburger, Werner, A Monolithic Transformer Coupled 5-W Silicon Power Amplifier with 59% PAE at .9Ghz, IEEE Journal of Solid-State Circuits, Dec. 1999, vol. 34, No. 12, pp. 1881-1892.
Sorenson, Jeff, Direct-Access Arrangements Are Crucial to Successful Embedded-Modem Designs, Electronic Design, Aug. 20, 2001, pp. 66-78.
Stapleton, Helen, Isolation Techniques for High-resolution Data-acquisition Systems, EDN, Feb. 1, 2000, pp. 113-118.
Tang, S.C., A Low-Profile Wide-Band Three-Port Isolation Amplifier with Coreless Printed-Circuit-Board (PCB) Transformers, IEEE Transactions on Industrial Electronics, Dec. 2001, vol. 48, No. 6, pp. 1180-1187.
Walker, Geoff, An Isolated MOSFET Gate Driver, pp. 1-6, 1996.
Walker, Geoffry, Modulation and Control of Multilevel Converters, Thesis submitted for Doctor of Philosophy (The University of Queensland), Nov. 16, 1999, pp. 1-202.
Ward Titus, John Kenney, "10 GHz VCO for 0.13um CMOS Sonet CDR," Analog Devices, pp. 1-4, Jun. 2006.
Wolfs, P.J., An Improved Transformer Coupled MOSFET/IGBT Driver, Journal of Electrical and Electronic Engineering, Australia—IE Aust. & IREE Aust., Sep. 1991, vol. 11, No. 03, pp. 197-200.
Young, Ron, Feedback Isolation Augments Power-Supply Safety and Performance, EDN, Jun. 19, 1997, pp. 141-146.
Zhou, Jian-Jun and Allstot, David, A Fully Integrated CMOS 900MHz LNA Utilitzing Monolithic Transformers, ISSCC Digest of Technical Papers, pp. 132-133, 1998.
Zhou, Jianjun, Monolithic Transformers and Their Application in a Differential CMOS RF Low-Noise Amplifier, IEEE Journal of Solid-State Circuits, Dec. 1998, pp. 2020-2027.

* cited by examiner

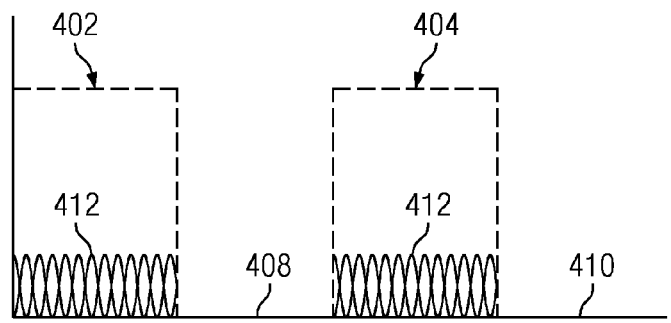
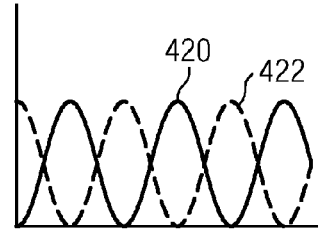
FIG. 4  FIG. 4a
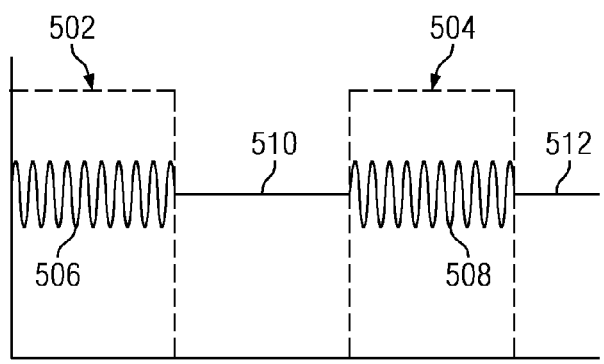
FIG. 5
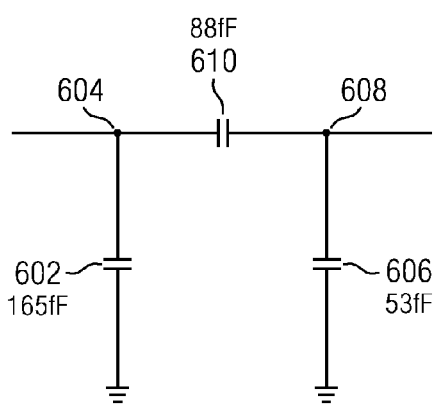
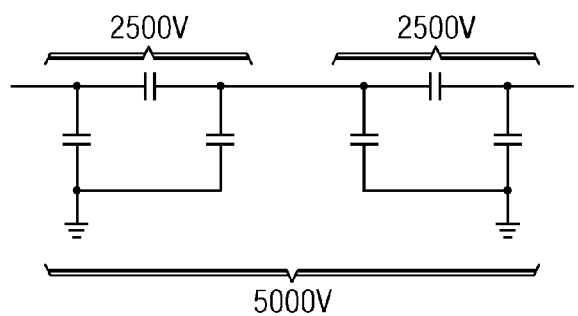
FIG. 6  FIG. 7

| BIT | 0 | 1 | 2 | 3 | 4 | 5 | 6 | 7 |
|---|---|---|---|---|---|---|---|---|
| CH ON/OFF | CH0 | CH1 | CH2 | CH3 | CH4 | CH5 | CH6 | CH7 |

| BIT | 8 | 9 | 10 | 11 | 12 | 13 | 14 | 15 |
|---|---|---|---|---|---|---|---|---|
| CH DIR | CH0 | CH1 | CH2 | CH3 | CH4 | CH5 | CH6 | CH7 |

| BIT | 16 | 17 | 18 | 19 | 20 | 21 | 22 | 23 |
|---|---|---|---|---|---|---|---|---|
| DEF | DEF HI/LOW | INV | ENA/ DISABLE | LEFT/ RIGHT | OTP CONTROL | RES | RES | $I^2C$ EN |

| BIT | 24 | 25 | 26 | 27 | 28 | 29 | 30 | 31 |
|---|---|---|---|---|---|---|---|---|
| | $I^2C$ I/O | TM0 | TM1 | TM2 | TM3 | OTP0 | OTP1 | OTP2 |

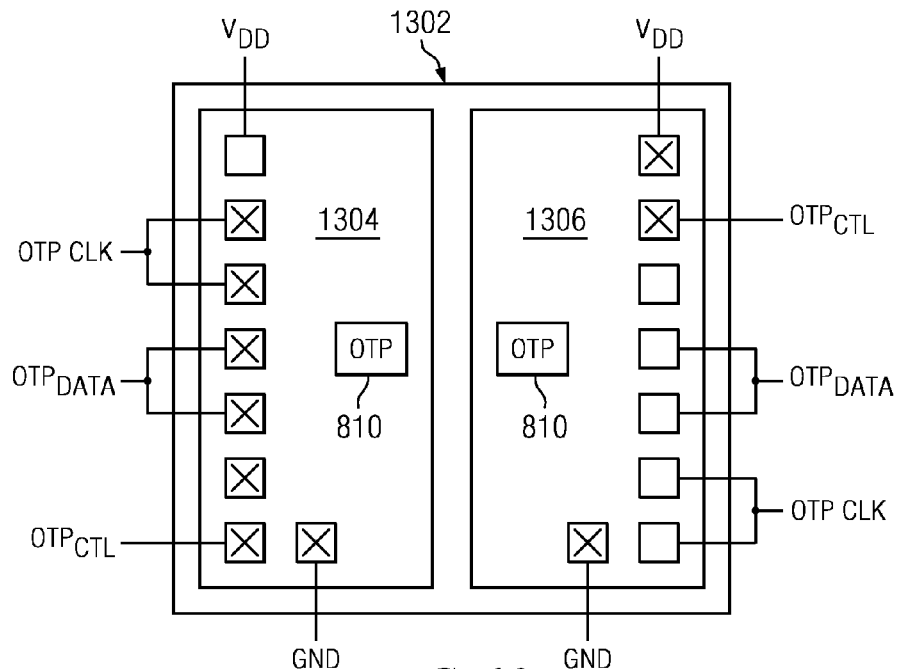
FIG. 13
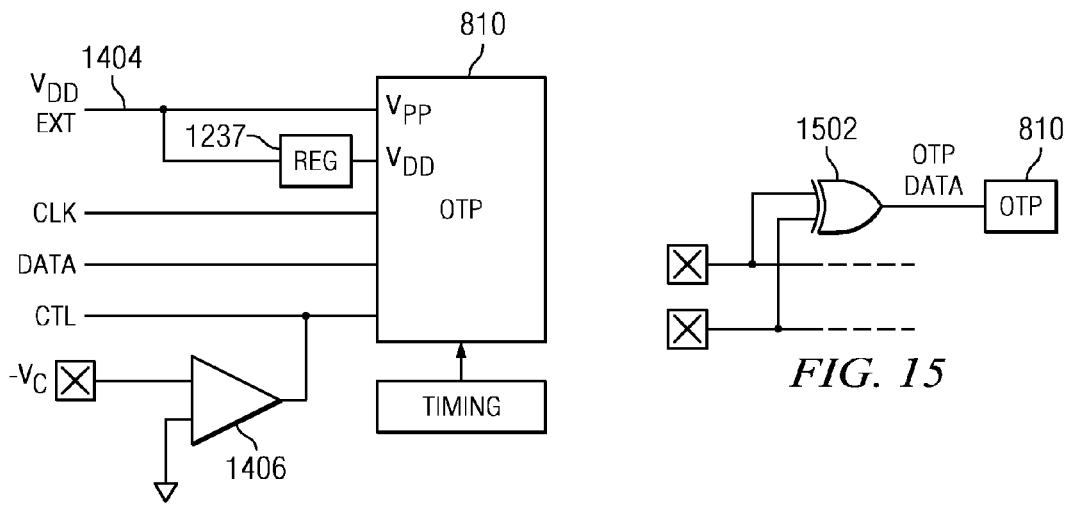
FIG. 14
FIG. 15

ISOLATOR WITH COMPLEMENTARY CONFIGURABLE MEMORY

CROSS-REFERENCE TO RELATED APPLICATIONS

The present invention is a Continuation-in-Part of U.S. patent application Ser. No. 12/060,049, filed Mar. 31, 2008, entitled "CAPACITIVE ISOLATOR," (now U.S. Pat. No. 8,169,108) which is a Continuation-in-Part of U.S. patent application Ser. No. 11/772,178, filed Jun. 30, 2007, entitled "BIDIRECTIONAL MULTIPLEXED RF ISOLATOR," (now U.S. Pat. No. 8,049,573) which is a continuation-in-part of pending U.S. Pat. No. 7,302,247, issued Nov. 27, 2007, entitled SPREAD SPECTRUM ISOLATOR which is a continuation-in-part of U.S. Pat. No. 7,421,028, issued Sep. 2, 2008, entitled TRANSFORMER ISOLATOR FOR DIGITAL POWER SUPPLY, and is a continuation-in-part of U.S. Pat. No. 7,447,492, issued Nov. 4, 2008, entitled ON-CHIP TRANSFORMER ISOLATOR, and U.S. Pat. No. 7,376,212, issued May 20, 2008, entitled RF ISOLATOR WITH DIFFERENTIAL INPUT/OUTPUT and U.S. Pat. No. 7,460,604, issued Dec. 2, 2008, entitled RF ISOLATOR FOR ISOLATING VOLTAGE SENSING AND GATE DRIVERS all of the above which are incorporated herein by reference in their entirety.

TECHNICAL FIELD OF THE INVENTION

The present invention relates to digital isolators, and more particularly, to digital isolators providing isolation for voltage sensing.

BACKGROUND OF THE INVENTION

Within power conversion products, there is a need for high speed digital links that provide high isolation at a low cost. Typical digital links within power conversion products require a speed of 50-100 megabits per second. Isolation between the input and output of power conversion products is required in the range of 2,500-5,000 V. Existing solutions for providing a high speed digital isolation link have focused on the use of magnetic pulse couplers, magnetic resistive couplers, capacitive couplers and optical couplers.

SUMMARY OF THE INVENTION

The present invention disclosed and claimed herein, in one aspect thereof, comprises an isolator that includes first and second substantially identical circuitry galvanically isolated from each other and each having at least one communications channel thereon for communicating signals across an isolation boundary therebetween and each of said first and second circuitry having configurable functionality associated with the operation thereof. A coupling device is provided for coupling signal across the isolation boundary between the at least one communication channels of the first and second circuitry. First and second configuration memories are provided, each associated with a respective one of the first and second circuitry. First and second configuration control devices are provided, each associated with a respective one of the first and second circuitry and each configuring the functionality of the associated one of the first and second circuitry. The first and second configurable memories have stored therein complementary configuration information to control each of the functionalities of the first and second circuitry to operate in a complementary manner for communication of signals across the isolation boundary.

BRIEF DESCRIPTION OF THE DRAWINGS

For a more complete understanding of the present invention and the advantages thereof, reference is now made to the following description taken in conjunction with the accompanying Drawings in which:

FIG. 4 illustrates the waveforms present on the transmit side of the capacitive isolation link of FIG. 3;

FIG. 4a illustrates a zoom in view on the transmit side of the waveform of FIG. 4;

FIG. 5 illustrates the waveforms present on the receiving side of the capacitive isolation link of FIG. 3;

FIG. 6 illustrates a model of one of the capacitive isolation links;

FIG. 7 illustrates the voltages across each capacitor included within a capacitor isolation link and across the entire capacitive isolation link;

FIG. 13 illustrates a diagram of the program pin configuration;

FIGS. 14 and 15 illustrate a diagram of the OTP pin logic;

DETAILED DESCRIPTION OF THE INVENTION

Figure 1:
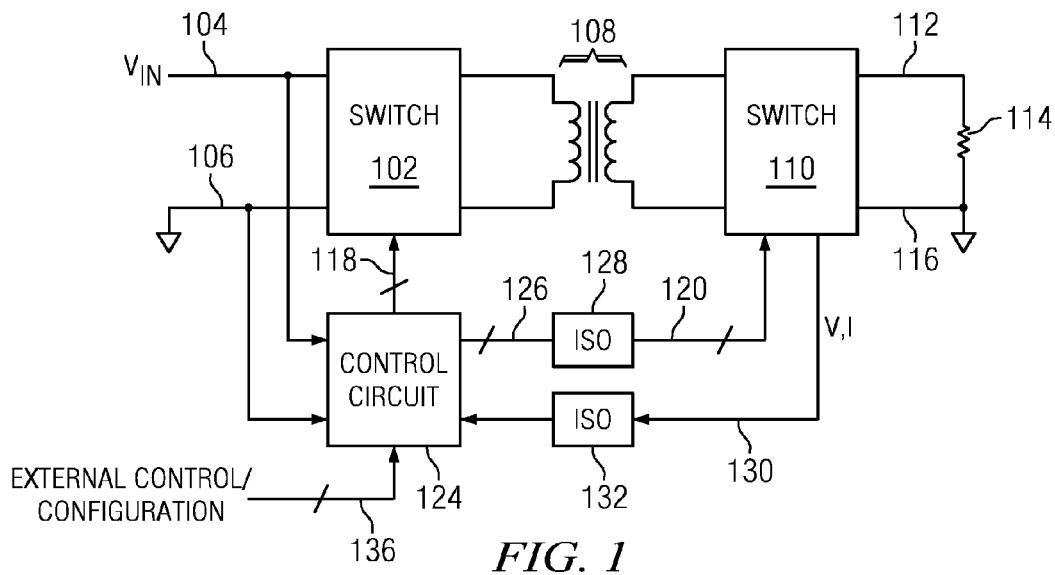
FIG. 1 illustrates a switched power supply including isolation circuitry.

Referring now to the drawings, wherein like reference numbers are used herein to designate like elements throughout, the various views and embodiments of an isolator with complementary configurable memory are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to the drawings, and more particularly to FIG. 1, there is illustrated a block diagram of a DC-DC switching power supply utilizing a capacitive isolation link. Switching power supplies utilize a plurality of switches which are turned on and off to switch an input DC voltage across an inductor to a load, the output voltage at a different DC voltage level. By switching the current inductively coupled through the inductor to the load in a particular manner, a DC output voltage at a different voltage level than the input DC voltage can be provided to the load. The controlled switching is typically facilitated with some type of control circuit. This control circuit can be an analog control circuit formed from a plurality of analog discrete devices, or it can be a digital circuit. In digital control circuits, digital signal processors (DSPs) and microcontroller units (MCU) have been utilized. The DSPs control the duty cycle and relative timing of the switches such that the edges of each control pulse to the various transistor switches controlling power delivery to the load is varied. In order to perform this operation in the digital domain, the DSP must perform a large number of calculations, which requires a fairly significant amount of code to be generated to support a specific power supply topology, operating frequency, component characteristics and performance requirements. For example, inductor size decreases with increasing PWM frequency, dead times increase with increasing transistor turn-off times, and so on. Although DSPs can handle the regulation tasks, they are fairly complex and expensive and code changes in power supply applications are difficult.

Referring further to FIG. 1, the power supply includes a primary switch group 102 that is operable to receive an input voltage on a node 104, this being a DC voltage, and ground on a node 106. The primary switch group 102 is coupled through a transformer 108 to a secondary switch group 110. The secondary switch group 110 is operable to drive an output voltage node 112 that is connected to one terminal of a load 114, the secondary switch group 110 also having a ground connection on a node 116, the load 114 disposed between the node 112 and the node 116. The two switch groups 102 and 110 are operable to operate in conjunction with various pulse inputs on a control bus 118 associated with the primary switch group 102 and with various pulse inputs on a control bus 126 associated with the secondary switch group 110.

A digital control circuit 124 is provided for controlling the operation of the primary switch group 102 and the secondary switch group 110. The voltages on nodes 104 and 106 are provided as inputs to the digital control circuit 124 for sensing the voltage and current on the primary side, the digital control circuit 124 generating the information on the bus 118 for control of the primary switch group 102. The control circuit 124 must be isolated from the secondary switch group 110, since there can be a significant DC voltage difference therebetween. This is facilitated by driving the bus 126 through a capacitive isolation circuit 128, such as the capacitive isolation circuit which will be discussed herein below, to drive the bus 120. Similarly, the control circuit 124 is operable to sense the voltage and current levels on the output node 112 through sense lines 130 which are also connected through a capacitive isolation circuit 132 to the digital control circuit 124. The digital control circuit 124 is also interfaced to a bus 136 to receive external control/configuration information. This can be facilitated with a serial databus such as an SMB serial databus.

Figure 2:
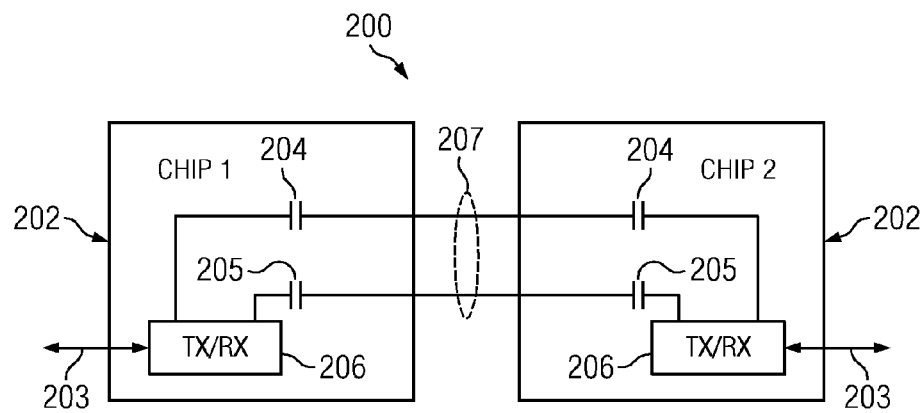
FIG. 2 illustrates a capacitive isolation link of the present disclosure.

Referring now to FIG. 2, there is illustrated the capacitive isolation link of the present disclosure. The capacitive isolation link 200 of the present disclosure is implemented by integrating a portion of the link in two chips or dies between which a high rate data link with voltage isolation is required. Each chip 202 includes a pair of capacitors 204 and 205 and transmit and receive circuitry 206 for providing the capacitive isolation link 200 between the chips. The capacitors may comprise vertical, horizontal or finger capacitors. Alternatively, the chip 202 could include only transmit circuitry or receive circuitry with the partnered chip, including a corresponding receiver or transmitter. RF signals are generated within the transmit/receive circuitry 206 on one side of the capacitive isolation link, and the RF signals are transmitted between the chips 202 utilizing the connection through capacitors 204 and 205 in each chip and the capacitive coupling therebetween.

Once the RF signals are received at the receiving side, the transmit and receive circuitry 206 detects the data contained within the transmission from the first chip and utilizes the data as appropriate. While the description with respect to FIG. 2 only illustrates the capacitors 204 and 205 and transmit and receive circuitry 206 within each chip 202, additional circuitry will be implemented on the chips 202 for performing processing functions associated with the data transmitted over the capacitive isolation link 200. The data transmitted over the capacitive isolation link 200 may be transmitted using either frequency modulation techniques or amplitude modulation techniques.

In operation, each of the transmit/receive circuits 206 operates in either transmit or receive mode. In the transmit mode, digital data received on a digital bus 203 is serially transmitted from one of the transmit/receive circuit 206 to the other one on the other of the chips 202. This is facilitated by driving the signal across capacitors 204 and 205 such that energy is coupled across the capacitors. This will allow energy to be transmitted on transmission lines 207 that couple the capacitors 204 and 205 together. A first side of capacitors 204 and 205 are with the input signal and energy associated therewith is coupled across the high voltage isolation boundary created by the capacitor and onto the transmission line 207. As will be described herein below, both of the transmit/receive circuits 206 and capacitors 204 and 205 are fabricated on an integrated circuit utilizing conventional processing techniques and available conductive layers that are shared with the transmit/receive circuits. There will be a loss associated with the coupling coefficient across the capacitor such that the amount of energy that can be delivered from the transmit/receive circuit 206 to the transmission line 207 is reduced and, further, there will be more loss at certain frequencies than others.

Figure 3:
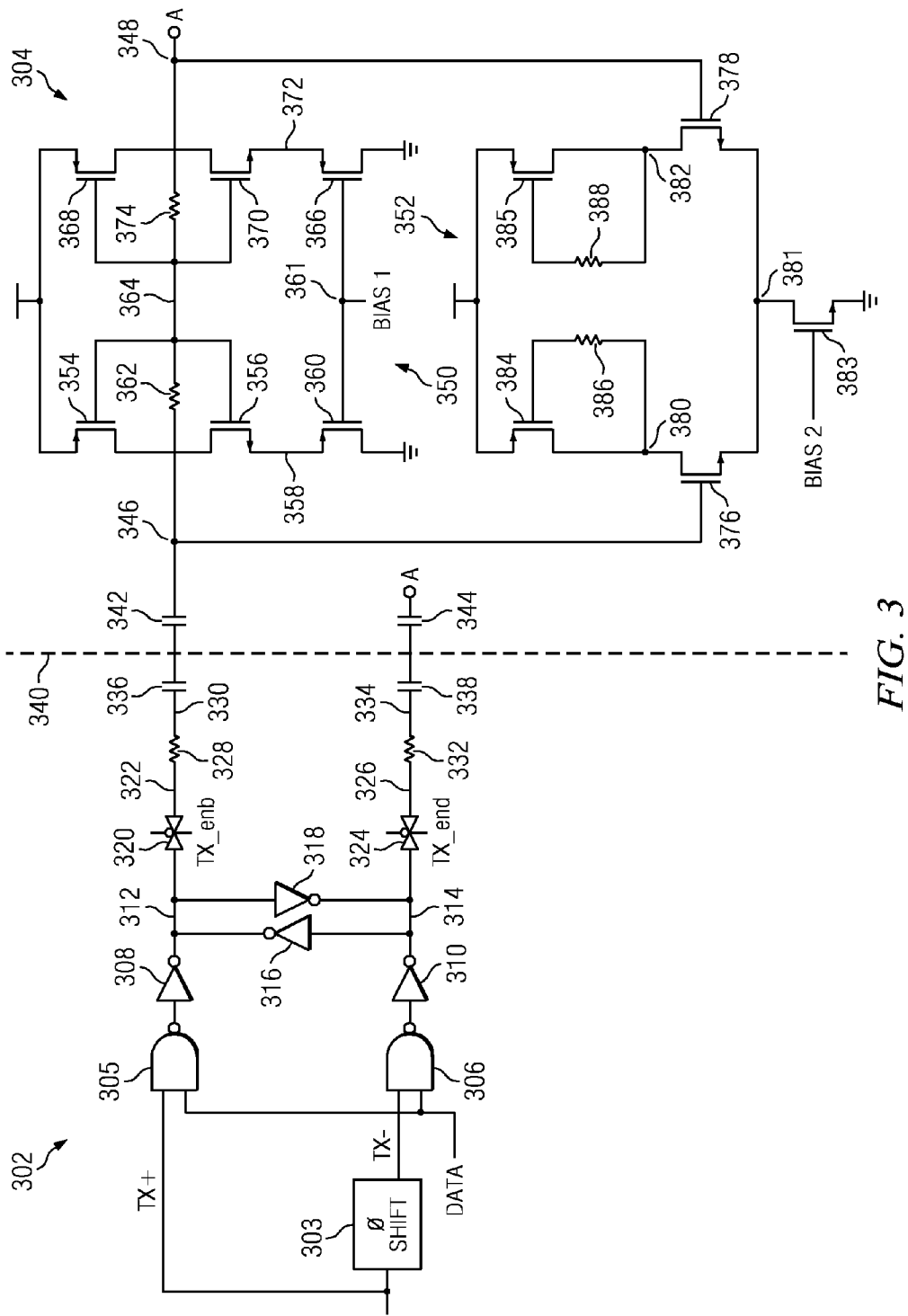
FIG. 3 illustrates a schematic diagram of the circuitry for providing the capacitive isolation link using amplitude modulation.

Referring now to FIG. 3 there is illustrated a disclosed embodiment of the capacitive isolation link 200 of the present disclosure wherein amplitude modulation is used to transmit data over the link. The capacitive isolation link 200 consists of transmitter circuitry 302 and receiver circuitry 304 (a differential receiver). The transmitter circuitry 302 consists of a pair of NAND gates 305 (a differential driver) and 306 having first inputs connected to receive the data to be transmitted over the capacitive isolation link and a second input connected to receive an RF carrier signal (16 Hz). In addition to RF signals it is noted that other types of AC (alternating current) signals may be used for the transmissions. The RF carrier signal applied to NAND gate 306 first goes through a phase shifter 303 which phase shifts the RF carrier 180 degrees. The output of each of the NAND gates 305 and 306 are connected to the inputs of inverters 308 and 310 respectively. The output of each of the inverters 308 and 310 are connected to nodes 312 and 314, respectively. An inverter 316 has its input connected to node 314 and its output connected to node 312. A second inverter 318 has its input connected to node 312 and its output connected to node 314. A first transmission gate 320 has its input connected to node 312 and its output connected to node 322. A second transmission gate 324 has its input connected to node 314 and its output connected to node 326. A resistor 328 is connected between node 322 and node 330. A second resistor 332 is connected between node 326 and node 334. Node 330 is connected with a first isolation capacitor 336 and node 334 is connected with a second isolation capacitor 338. The transmission gates 320 and 324 are enabled when the differential driver circuit is transmitting data over the capacitive isolation link. The RF transmission signal is continually applied to one input of NAND gates 305 and 306. When a 1-bit is also transmitted on the other input of the NAND gates 305 and 306, the RF signal is transmitted over each of the transmission lines of the capacitive isolation link with the RF signal on the TX− line being 180 degrees out of phase with the RF signal on the TX+ line. When a 0-bit is applied to the inputs of NAND gates 305 and 306, no RF signal is transmitted over the capacitive link.

The capacitors 336 and 338 are connected across an isolation barrier 340. As is more fully described herein below, the isolation barrier may be between different chips or different dies on a single chip. Capacitors 336 and 338 connect across the isolation barriers with isolation capacitor 342 and 344, respectively. Capacitors 342 and 344 are associated with the receiver circuitry 304. Capacitor 342 connects with the receiver circuitry at node 346. Capacitor 344 connects with the receiver circuitry at node 348. The receiver circuitry comprises a differential receiver consisting of a bias and transient common mode clamp circuitry 350 for preventing the receiver node from floating and limiting the input common mode voltage to the receiver from exceeding the operating range of the receiver protecting a receiver amplifier 352. The receiver amplifier 352 detects a received signal. The bias and transient clamp circuitry 350 comprises a P-channel transistor 354 having its source/drain path connected between $V_{DD}$ and node 346. An N-channel transistor 356 has its drain/source path connected between node 346 and node 358. A P-channel transistor 360 has its source/drain path connected between node 358 and ground. A resistor 362 is connected between node 346 and node 364. The gates of each of transistors 354 and 356 are connected to node 364. The gate of transistor 360 connects with the gate of a transistor 366 at node 361 which is connected to a circuit (not shown) providing a bias voltage BIAS 1. Transistor 368 is a P-channel transistor having its source/drain path connected between $V_{DD}$ and node 348. An N-channel transistor 370 has its drain/source path connected between node 348 and node 372. The P-channel transistor 366 having its gate connected with transistor 360 has its source/drain path connected between node 372 and ground. The gates of each of transistors 370 and 356 are connected to node 364. A resistor 374 is connected between node 348 and node 364. The bias and common clamp circuitry 350 clamps the receive input nodes to keep it from floating when no RF signal is applied and clamps the input voltage to the receiver.

The receiver amplifier 352 interconnects with the isolation capacitors at nodes 346 and 348 respectively. These nodes are connected with the gates of N-channel transistors 376 and 378. Transistor 376 is connected between nodes 380 and 381. Transistor 378 has its drain/source path connected between node 382 and node 381. A transistor 383 has its drain/source path connected between node 381 and ground. The gate of transistor 383 is connected to bias circuitry (not shown) providing a bias voltage BIAS 2. A P-channel transistor 384 has its source/drain path connected between $V_{DD}$ and node 380. A transistor 385 has its source/drain path connected between $V_{DD}$ and node 382. A resistor 386 is connected between the gate of transistor 384 and node 380. A resistor 388 is connected between the gate of transistor 385 and node 382. The receive signals over the capacitive link can be detected at either of nodes 380 and 382 and the received signal are offset from each other by 180 degrees. It should be understood that the capacitive isolation link could be replaced with an inductive isolation link.

Referring now to FIGS. 4, 4a and 5, there are illustrated the waveforms and data provided at the transmission side (FIGS. 4 and 4a) of a capacitive isolation link 200 and the receive side (FIG. 5) of the capacitive isolation link. On the transmission side illustrated in FIG. 4, the data is either transmitted as a one bit (high) or zero bit (low). A one bit pulse is indicated at 402 and 404. A zero bit pulse is indicated at 408 and 410. The transmit data provided to the capacitive link is illustrated by the waveform 412. The transmit data waveform represents the 1 GHz RF carrier signal. When a logical "1" data bit is being transmitted and the data signal is high, the presence of the RF carrier is provided at the transmit data output. The RF carrier signal can be of any frequency. The use of different frequencies enables the provision of lower power circuitries with lower frequencies. When a logical "0" bit is being transmitted, the signal is virtually zero at the transmit data output. Thus, whether a logical "1" bit or a logical "0" bit is transmitted is indicated either by the presence or absence of the RF carrier signal.

FIG. 4a illustrates the manner in which the wave form 412 is transmitted on each of the transmission lines of the capacitive link 200. A first RF signal 420 comprises the information transmitted on the TX+ line of the capacitive link from the differential driver. The wave form 422 comprises the inverted format of the RF signal on the TX− line that is 180 degrees out of phase with signal 420.

FIG. 5 illustrates the waveforms associated with the receiver 304. The received data for the logic "1" bit is represented at points 502 and 504 and indicates the two 1 GHz RF carrier pulses transmitted from the transmitter 302 of the capacitive isolation link 200. The received pulses are amplified by the amplifier 352 such that the pulses are represented by the amplified waveform pulses 506, 508, 510 and 512. The detector data output rises to $V_{DD}$ at points 51 and 512 when no RF carrier signal is detected indicating a logical "0." When an RF carrier signal is detected, the output of the detector 306 begins to vary at points 506 and 508 indicating a logical "1," this being the result of an increase in the NMOS current in transistors 376 and 378.

Referring now to FIG. 6, there is illustrated a model for the capacitors 316, 320, 322 and 326. Capacitor 602 represents a 165 fF capacitor connected between node 604 and ground. Capacitor 606 represents a 53 fF capacitor connected between node 608 and ground. Connected between node 604 and node 608 is represented by an 88 fF capacitor 610.

Using the RF isolation links 200 described above, voltage isolation of up to 5,000 volts may be achieved, 2,500 volts for each side. Thus, as illustrated in FIG. 7, the RF isolation circuit may provide 5,000 volts of isolation between a first chip and a second chip. While the voltage between the input terminals of the chip will be zero volts, and the voltage between the input terminals of the chip will also be zero volts, the total voltage difference between the two chips may be 5,000 volts with a 2,500 voltage difference across each of the capacitors associated with the interfaces to the capacitive isolation circuit on each chip.

Figure 8A:
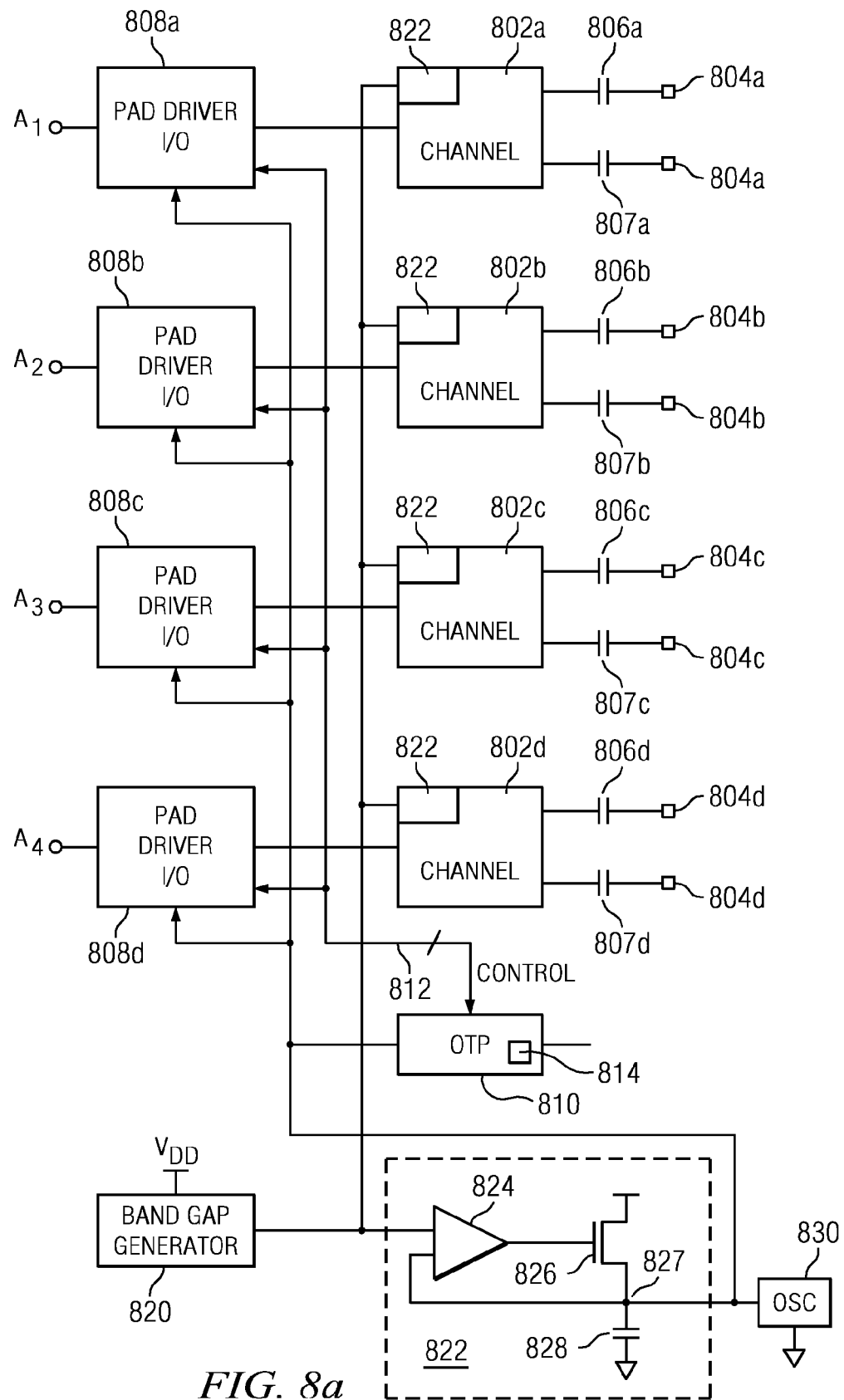
FIG. 8a is a block diagram illustrating the circuitry included within a chip on one side of the capacitive isolation link for providing multiple isolation link channels.

Referring now to FIG. 8a, there is illustrated a block diagram of the structure of an interface of a single chip 202 including a portion of a plurality of channels 802 including the capacitive isolation link of the present disclosure. Each channel 802 consists of the a pair of capacitors 806 and 807 and transmit and/or receive circuitry described with respect to FIG. 3. Data may be either input or received at the interface 804 of the capacitive isolator. Each channel 802 is interconnected with a pad driver 808 that either drives transmitted data from the pad driver over channel 802 to be output over the interface 804 or drives received data to the associated pad of the chip 202. The manner in which data can be either transmitted or received over a particular channel 802*a* is controlled on the chip 202 by configuration data stored in a One Time Programmable (OTP) non-volatile Memory 810 providing control over various control lines 812. The manner in which the OTP 810 controls whether a channel is used for transmitting or receiving is set by the stored configuration data 814. Thus, in this embodiment, data is received as either a logic "1" or a logic "0" and the associated capacitive isolator is driven, when a pad is configured as a transmitter, (or not driven) accordingly. For received data on the associated capacitive isolator, when configured to receive data, the output of the pad is either high or low.

An oscillator circuit 830 is also associated with all of the channels of the interface. A band gap generator 820 is provided on-chip and connected to $V_{DD}$ to provide a band gap reference voltage to a regulator circuit 822. While the description with respect to FIG. 8*a* only illustrates a single voltage regulator 822, it will be noted that a separate voltage regulator 822 will be associated with each of the channels of the interface for noise purposes. The voltage regulator 822 consists of an amplifier 824 having one input connected to the output of the band gap generator 820. The output of the amplifier 824 is connected to the gate of a transistor 826. The drain-source path of the transistor 826 is connected between $V_{DD}$ and a node 827. Node 827 is also connected to the second input of the differential amplifier 824. A capacitor 828 is connected between node 822 and ground. Each of the channels 802*a*, 802*b*, 802*c* and 802*d* has a regulator 822 associated therewith. Connected to node 827 is an oscillator circuit 830.

Figure 8B:
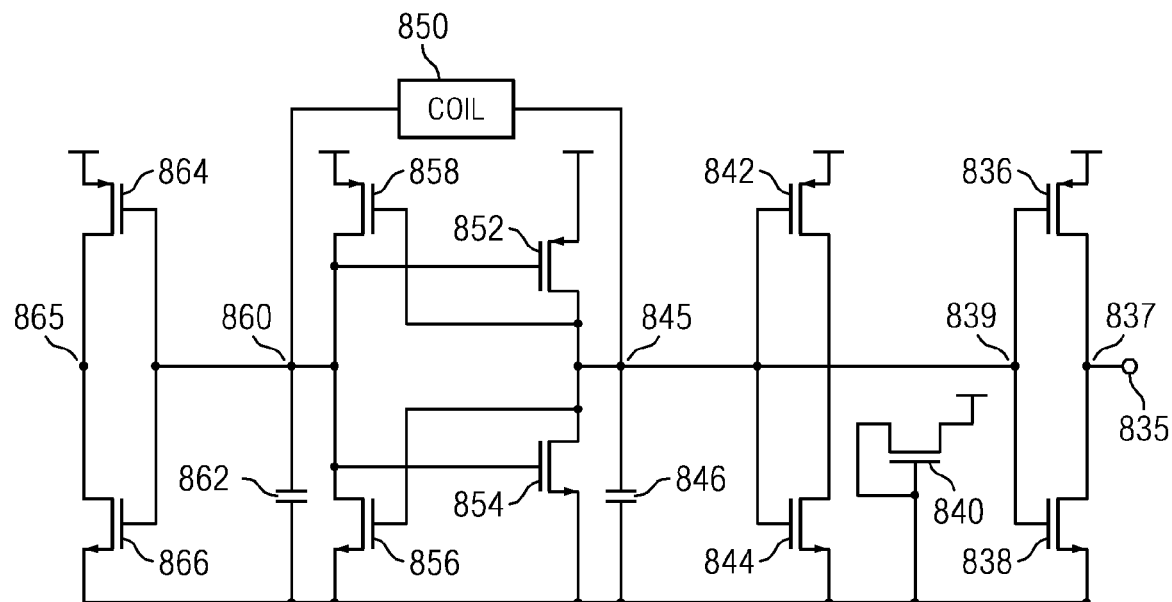
FIG. 8b is a schematic diagram of an oscillator circuit.

FIG. 8*b* illustrates the oscillator circuit 830 of FIG. 8*a*. The output 835 is connected to node 837 between transistor 836 and transistor 838. The drain-source path of transistor 836 is connected between $V_{DD}$ and node 837. The drain-source path of transistor 838 is connected between node 837 and ground. The gates of transistor 836 and 838 are connected to each other through a node 839. A transistor 840 has its gate connected to ground and its drain-source path connected between $V_{DD}$ and the gate of transistor 840. Node 839 also interconnects transistor 842 and transistor 844. The drain-source path of transistor 842 is connected between $V_{DD}$ and node 839. The drain-source path of transistor 844 is connected between node 839 and ground. The gates of transistors 842 and 844 are interconnected with each other via node 845. A capacitor 846 is connected between node 845 and ground. Node 845 is connected to a first terminal of coil 850. The second terminal of coil 850 interconnects with the circuit via node 860. Transistors 852 and 854 are interconnected via node 845. The drain-source path of transistor 852 is connected between $V_{DD}$ and node 845. The drain-source path of transistor 854 is connected between node 845 and ground. The gates of both transistor 852 and 854 connect to node 860. Transistors 858 and 856 are interconnected via node 860. The drain-source path of transistor 858 is connected between $V_{DD}$ and node 860. The drain-source path of transistor 856 is connected between node 860 and ground. The gates of transistors 858 and 856 connect to node 845. The capacitor 862 is connected between node 860 and ground. Also connected to node 860 are the gates of transistors 864 and 866. The drain-source pathway of transistor 864 is connected between $V_{DD}$ and node 865, and the drain-source pathway of transistor 866 is connected between node 865 and ground. This oscillator therefore comprises a conventional LC oscillator.

Figure 9:
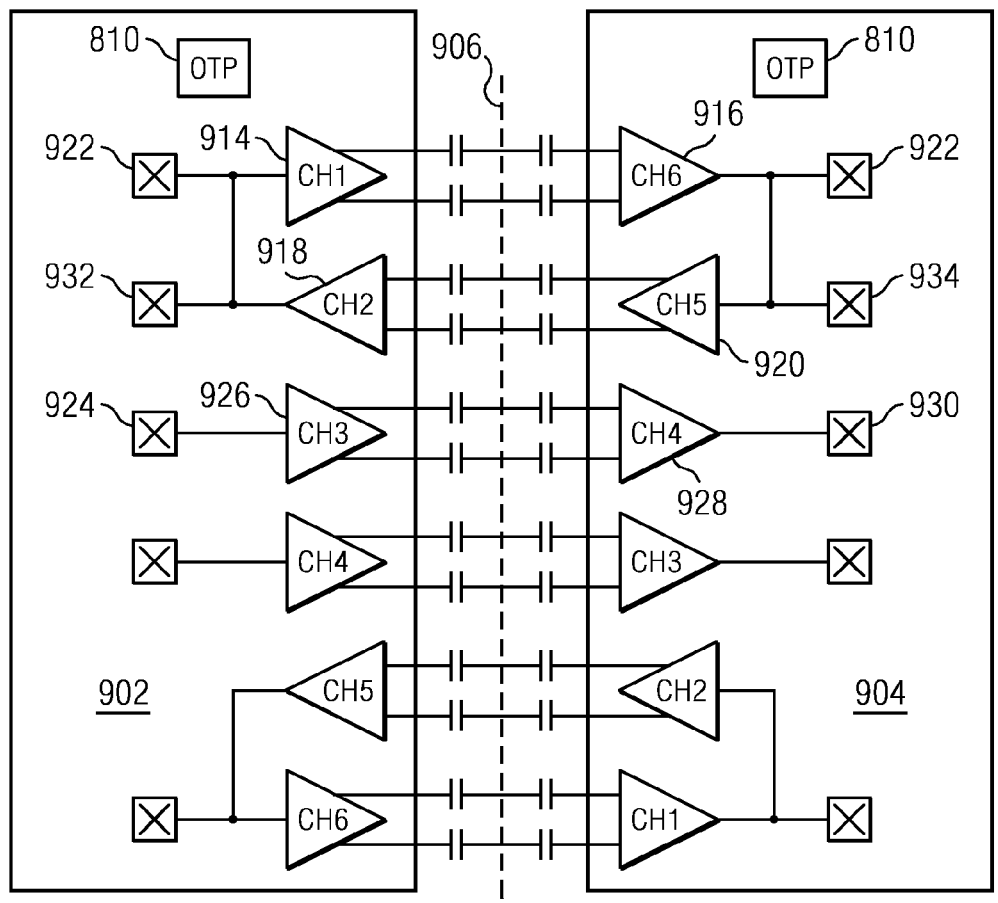
FIG. 9 illustrates a diagrammatic view of one configuration of two isolator chips in a package.
Figures 9A, 10:
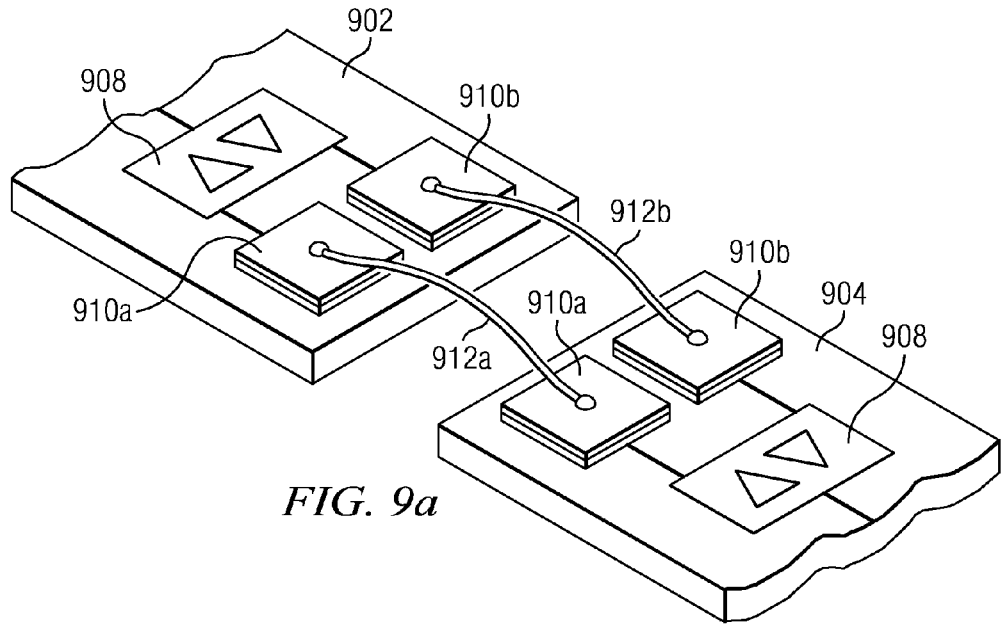
FIG. 9a is a further view of two isolator chips in a package.
FIG. 10 illustrates a map of the OTP.

Referring now to FIG. 9, there is illustrated a diagrammatic view of the manner in which the single chip design described herein above can be used to facilitate an entire capacitive isolation circuit including configuration of six separate channels in a particular configuration defined by the configuration data stored in the OTP 810. In this embodiment, within a package, there are provided two separate chips 902 and 904, both of the chips 902 and 904 being identical chips except that chip 904 represents a rotation of 180° relative to chip 902. Both chips 902 and 904 are disposed in a package such that they are galvanically isolated from each other about an isolation boundary 906. This will be described in more detail herein below. As noted herein above, there are multiple channels provided, each channel having the ability to transmit data in one direction across a pair of capacitors (this being a differential configuration) to the other side thereof for reception thereon. This is illustrated in FIG. 9*a*, where each channel is comprised of a transceiver 908 and each has two capacitors 910*a* and 910*b* associated therewith (for the differential configuration). The top plate of the capacitors 910*a* are connected together on the respective chips 902 and 904 by a bond wire 912*a* and the top plates of capacitors 910*b* on the respective chips 902 and 904 are connected together by bond wire 912*b*. It is noted that the top plates of the capacitors are separated from the substrate and the bottom plate of the capacitors by a dielectric. Each of the bottom plates of the respective capacitors 910*a* and 910*b* are connected on-chip to the respective transceiver 908 to provide differential connection thereto.

Referring back to FIG. 9, on the chip 902, there are provided six channels that are pre-configured by the respective OTP 810. On chip 902, the configuration is that associated with an I²C configuration. In this configuration, it is required that a particular input be bidirectional, i.e., data can be transmitted from one side to the other and transmitted from the other side to the one side. Thus, what is required is that two channels must be utilized and connected to the same pad. Further, one side must be defined as a master for a clock signal and one channel must be dedicated to transmit a clock from one side to the other. In this configuration, chip 902 is the input side of the I²C such that channel 1 and channel 2 are associated with the data port and channel 3 is associated with the clock port. Therefore, channel 1 and channel 2 of chip 902 are configured such that channel 1 provides a transmitter function with the transmitter function 914 and the corresponding channel on chip 904 provides a receive function with the receiver 916. Similarly, channel 2 on chip 902 is configured for a receive function with a receiver 918 wherein the corresponding channel on chip 904 provides a transmit function with a transmitter 920. It should be understood that the transmitter 914 on channel 1 has a corresponding receiver which is not enabled, as the direction is from input pad 921 to the transmitter 914, i.e., this is the data input. Similarly, the transmitter 916 is connected to an output pad 934. However, it should be noted that the configuration is such that the channels on chip 902 are mapped to the opposite direction of channels on chip 904. The mapping is such that channel 1 on chip 902 is connected to channel 6 on chip 904, channel 2 on chip 902 is connected to channel 5 on chip 904 and so on such that channel 6 on chip 902 is connected to channel 1 on chip 904.

Continuing with the configuration illustrated in FIG. 9, the clock function of the I²C serial data protocol will be associated with the channels, such that the data and clock comprise two serial data paths, one for data and one for timing. Since there are six channels, this will allow for two I²C channels, which first I²C channel has the data associated with channel 1 and channel 2 on chip 902 and complementary channel 5 and complementary channel 6 on chip 904. The I²C clock would be associated with channel 3 on chip 902 and complementary channel 4 on chip 904. This is configured such that a pad 924 on chip 902 is associated as an input and interfaced with channel 3 which is configured for a transmit function with a transmitter 926 that transmits across the isolation boundary 906 to a complementary receiver 928 on channel 4 of chip 902 to provide an output on complementary pad 930. Thus, channel 1, channel 2, and channel 3 on chip 902 are associated with channel 6, channel 5 and channel 4 on chip 904 in a complementary manner for one I²C channel. The remaining communication channels on the chip are associated with a second I²C channel which utilizes channel 5 and channel 6 on chip 902 and channel 1 and channel 2 on chip 904 as the data path and the clock for that I²C channel is associated with channel 4 on chip 902 and channel 3 on chip 904 such that direction is from chip 902 towards chip 904 across the isolation boundary 906. The purpose for this is to provide the I²C function. Further, it is noted that, in order to provide an I²C function, two communication channels must be associated on each chip with a single bond pad. Therefore, there is a multiplexing function (not shown) that utilizes only a single pad, pad 921 for chip 902 and a single pad 934 on chip 904 for the I²C function. There will be associated with channel 2 on chip 902 an output pad 932 and with channel 6 on chip 904 a pad 922. Both pads 932 and 922 are not bonded out or utilized in this configuration. As such, even though there are six channels, only four pads on each chip will be bonded out to provide for the two data channels and two clock channels. However, it should be understood that the OTP 810 could be configured such that channels 4, 5 and 6 on chip 902 and the corresponding channels, channel 3, 2 and 1, on chip 904 could be configured as three data channels with an I²C function associated with channel 1, channel 2 and channel 3 on chip 902 and corresponding and complementary channels, channel 6, channel 5 and channel 4, on chip 904. Further, the OTP 810 for each of the respective chips can be configured such that the directions on either of the I²C channels can be in one direction or the other. The data stored in the OTP 810 provided a control bit that is then processed by combinatorial logic to implement the command. The function could be as simple as defining one of the pins to perform the enable function for the overall associated chip. This can be implemented by multiplexing a select one of the bond pads such that pulling the pin high will cause a high voltage to be placed on the chip enable input. When not selected, chip enable is internally connected to a high voltage. Thus, each control bit is interpreted by associated combinatorial logic to implement the associated command.

As will be noted and described in more detail herein below, each of the OTPs 810, although identical, will provide a program that is complementary. It is important to note that each of the OTPs must be programmed independently utilizing the pins (which are multiplexed) on the associated side of the isolation boundary for the programming operation. Therefore, a programming mode will be entered which will cause the OTP 810 to go into a program mode for programming thereof. It is noted that an OTP is a non-volatile memory that can be programmed one time and this program is then unable to be erased. However, the configuration for chip 902 must be complementary to the configuration for chip 904, i.e., if channel 1, for example, on chip 902 were programmed to be an input, channel 6, the complementary channel, on chip 904 would be required to be configured as an output. Further, if an I²C function were required, it would be necessary that the OTP 810 associated with chip 902 be programmed such that channel 1 and channel 2 be programmed as a data channel and only one pad associated therewith and the corresponding and complementary channels, channel 5 and channel 6, on chip 902 be programmed similarly and that channel 3 on chip 902 and channel 4 on chip 904 be configured as a clock function such that the clock will go in the appropriate direction, i.e., as an input on chip 902 and as an output on chip 904. Thus, the two stored configurations must be complementary. Therefore, the programs, although different, must compliment each other once programmed. Further, it is noted that the use of the OTP removes a need to program a chip with a bond wire option at manufacturing and thus provides more versatility for a particular chip. This will be described in more detail herein below.

Referring now to FIG. 10, there is illustrated a mapping function for the OTP 810. This is a 32-bit memory such that a 32-bit data word can be programmed. It is programmed such that each bit is a control bit. Bits 0 through 7 define 8 channels (although only 6 channels are utilized on the disclosed embodiment). This defines whether a channel is enabled or disabled. Bits 8 through 15 then define the direction of the channel such that a logic "1" defines a first direction and a logic "0" defines a second direction. It should be noted that flash memories are typically at a default state of a logic "1" and programmed to a logic "0" when the value therein is "permanently" changed. Thus, the initial state will be that all channels are off until programmed with a logic "0."

It is noted that Channel 1, Channel 2, Channel 8 shall be referred to as CH0, CH1, . . . , CCH7, and the two may be interchangeable.

Figure 11:
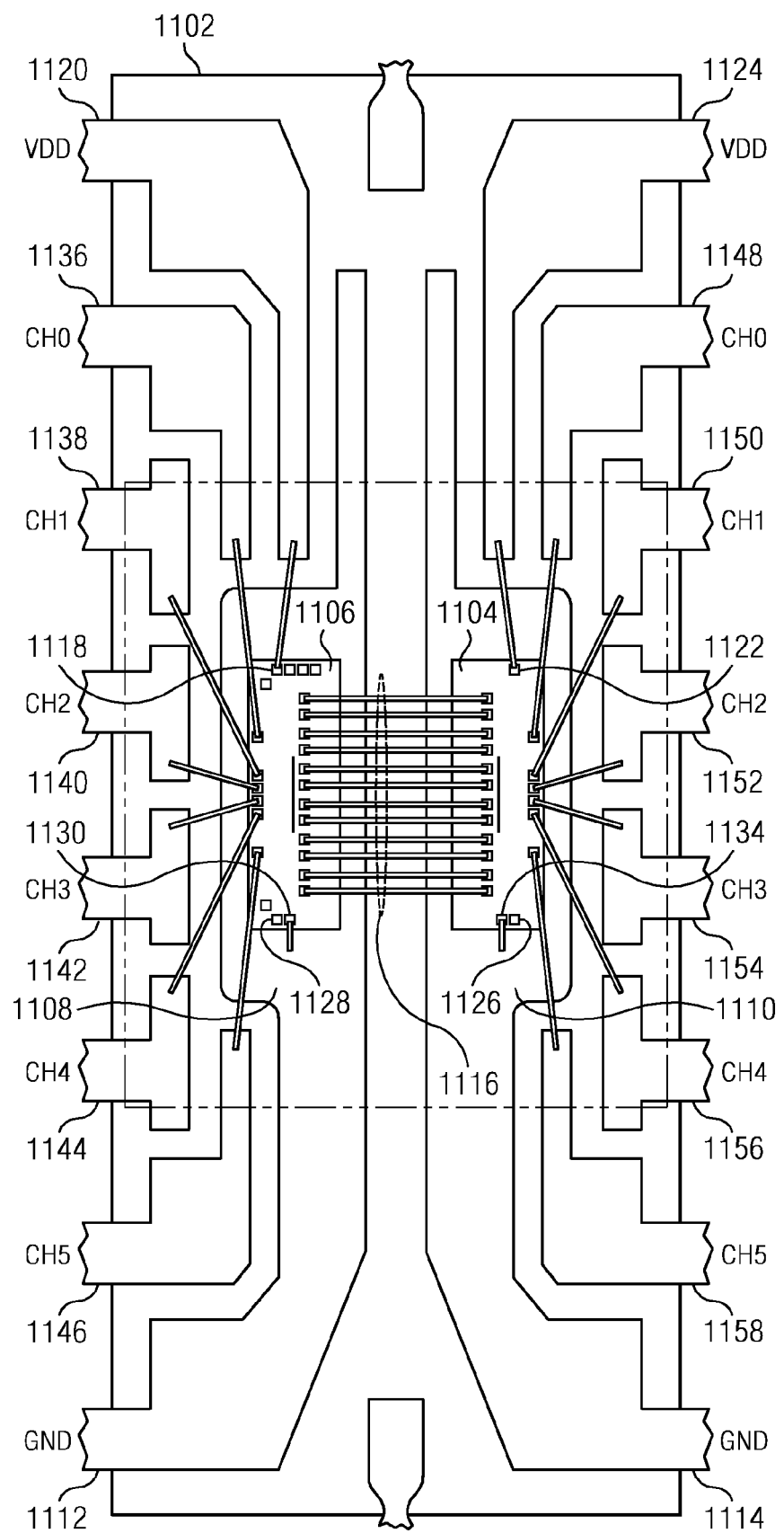
FIG. 11 illustrates a detail of the chips mounted on a lead frame.

Bit 16 defines the default value of the output. Upon power up, the output will either be at a logic "high" or a logic "low" depending upon the value of the bit. Bit 17 defines whether the data path is an inverting data path or non-inverting data path, i.e., the isolator along one channel appears as an inverter or a non-inverter. Bit 18 is an enable/disable bit which, when programmed, will define the output CH5 on each of the left and right dies as being an enable pin as opposed to a channel pin, i.e., a channel is sacrificed to provide this function on the pin. Bit 20 is associated with the OTP operation and, when programmed, this will prevent further programming of the bits. It should be understood that an OTP is a non-volatile memory and bits that are "programmed" will be changed from a logic "1" to a logic "0." For those bits that have not been changed, they could still be programmed if desired. However, when bit 20 is changed from a logic "1" to a logic "0," then such further programming will be inhibited. Bits 21 and 22 are reserve bits. Bit 23 is an I²C enable bit that defines the particular chip as being enabled for the I²C function. Bit 24 defines whether the particular die is the input or the output. For example, in one mode, the I²C operation is enabled which means that CH0 and CH1 are one path for data and CH4 and CH5 are a second path for data. Both of these will be programmed as being a driver or a receiver. If they are a driver on the left die, they must be a receiver on the right die. Therefore, it will be an input on the left die and an output on the right die and the bit must be so programmed. It could, of course, go in the opposite direction. When the I²C enable is controlled in the direction it is controlled, this will also program CH2 and CH3 as the clock in the right direction. Additional bits could be provided and utilized individually to program the I²C path such that only half of the chip were programmed as an I²C and the other half were programmable for data channels.

non-volatile memory Referring now to FIG. 11, there is illustrated a diagrammatic view of the manner by which the two isolator chips are disposed within a package. The package is defined by a boundary 1102 and there are provided two chips 1104 and 1106. The die is configured such that there is a die mounting area 1108 to which the chip 1106 is mounted and a die mounting area 1110 to which the chip 1104 is mounted. These particular die mounting areas 1108 and 1110 are associated with a ground pin 1112 and a ground pin 1114, respectively. The two mounting areas 1108 and 1110 are galvanically isolated from each other. Each of the chips 1104 and 1106 has associated therewith six channels in this disclosed embodiment, each having associated therewith two capacitors and two bonding wires such that there are a plurality of bond wires 1116 associated therewith, there being six pairs or 12 bond wires. Each of the chips 1104 and 1106 has associated therewith on both sides thereof a $V_{DD}$ pad such that the uppermost side can be bonded to a $V_{DD}$ pin. For example, there is provided a pad 1118 on one side of the chip 1106 that is bonded to a $V_{DD}$ pin 1120. This is on the left side of the chip. On the chip 1104 on the right side, there is provided a pad 1122 on chip 1104 that is bonded to a $V_{DD}$ pin 1124 corresponding to the pin 1120 on the left side. However, there is also provided a $V_{DD}$ pad 1126 on the other side of the chip 1104 and this corresponds to pad 1118 on chip 1106 on the left side. Similarly, there will be a $V_{DD}$ pad 1128 on the opposite side of the chip 1106 from pad 1118 which is a $V_{DD}$ pad that corresponds to pad 1122. Therefore, there are provided on both edges of the chip a $V_{DD}$ pad and a ground pad which are only bonded to the respective sides. Therefore, the $V_{DD}$ pad closest to pin 1120 on the left side will be bonded thereto and the $V_{DD}$ pad closest to the $V_{DD}$ pin 1124 on the lead frame will be bonded out on the chip on the right side. Similarly, the ground pad 1130, 1134 on the opposite side will be bonded to the mounting area, i.e., the ground pin associated with the respective side.

There are provided for a six channel chip, six separate input/output pads that will be connected to respective output pins on the lead frame. On the left side, for chip 1106, there are provided six channel outputs, CH0, CH1, CH2, CH3, CH4 and CH5 associated with respective pins 1136-1146. Correspondingly, there will be provided on the lead frame six output pins per channel, CH0, CH1, CH2, CH3, CH4 and CH5 labeled with respective reference pins 1148-1158 associated with the input/output pads on chip 1104. It should be noted that channel CH0 on pin 1136 corresponds to channel CH0 on pin 1148, such that data can be transferred in one direction therebetween. However, CH0 on pin 1136 is associated with the channel CH0 on chip 1106 but pin 1148 will be associated with CH5 on chip 1104 as described herein above, as this is the complementary configuration.

Figure 12:
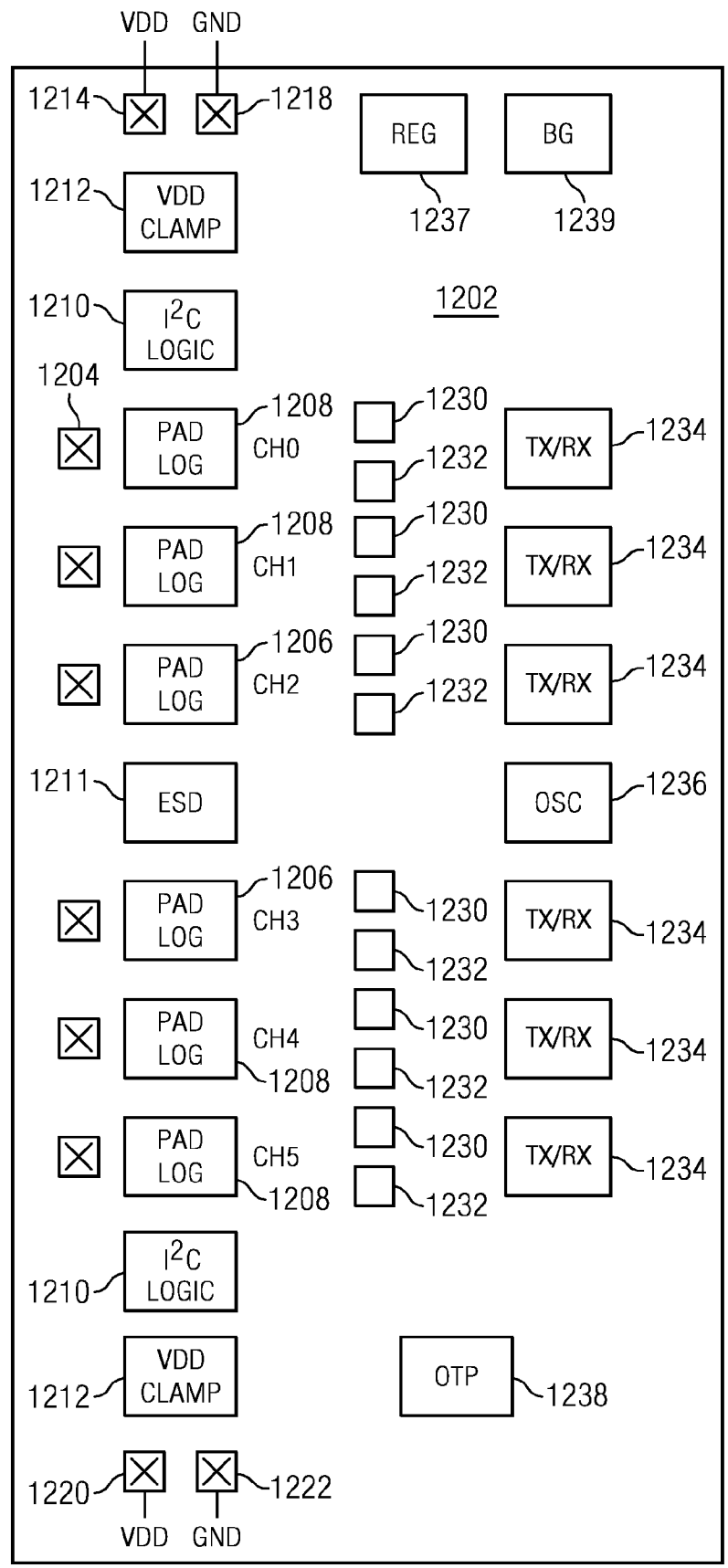
FIG. 12 illustrates a diagram of the chip layout on a functional block basis.

Referring now to FIG. 12, there is illustrated a diagrammatic view of the layout for each of the chips 1106 and 1104 defined as a chip 1202. Each of the channels will have an input/output pad 1204 associated therewith that can be bonded to a respective pin. Each channel will have associated therewith various pad logic. For channels CH2 and CH3, the pad logic will be the same, i.e., pad logic 1206. For channel 4 and channel 5, there will be pad logic 1208 which will be associated with an I²C functionality, as provided by block 1210, as will be described herein below. This is because for an I²C functionality, only these two pads on the edge will be associated with a data functionality. The reason for this is that bidirectional data must be associated with one output pin. There is provided an ESD clamp 1211 disposed between pad logic 1206 for CH2 and CH3. There is provided a $V_{DD}$ clamp 1212 on either side of the pad logic. There will be provided a $V_{DD}$ pad 1214 and a ground pad 1218 on one side and a $V_{DD}$ pad 1220 and 1222 on the other side. As noted herein above, on one side of the package, $V_{DD}$ pad 1214 will be bonded out and, on the other side of the package, $V_{DD}$ pad 1220 will be bonded out and the corresponding ground pad will also be bonded out on the opposite side thereof. Each channel has associated therewith two capacitors 1230 and 1232 and also a Tx/Rx transceiver. In the middle of the transceivers in the chip on the right side of the chip is provided the oscillator as a block 1236. The OTP is provided by block 1238 on one end of the chip. All of the functionality and the control lines disposed therefrom will run to each of the pad logic and Tx/Rx blocks 1234 for enabling/disabling and configuration thereof. A voltage regulator 1137 and bandgap generator 1139 are also provided. It should be understood that any type of configuration could be provided such that a particular direction can be associated with a particular channel, a particular input/output configuration could be provided and any type of configuration could be associated therewith to provide a corresponding functionality to a particular channel. There can be provided multiplexers, modulation, etc. that could be associated with any particular channel to provide a unique functionality therefore. This is merely a function of the way the OTP and the control logic is provided on chip. It is noted that for any particular channel, defined by data being input to one side and data being output from the other side that the function is complementary. Data can only be transmitted in one direction at any one time across a particular channel. However, it should be understood that, although dedicated data transmission is associated with the functionality described herein above, it could be that a single channel could be multiplexed such that in time it could transmit data at one time, and at another point in time data could be transmitted in the other direction. Again, this is a function of the logic implemented on the chip. However, for any given time, the configuration must be complementary and this is defined by the way the OTP is programmed.

Referring now to FIG. 13, there is illustrated a diagrammatic view of a packaged chip defined by a package 1302 which has disposed therein two chips 1304 on the left side and 1306 on the right side. Each of the chips 1304 and 1306 has an OTP 810 associated therewith. Each of these is associated with either a left side or a right side and will be programmed in a complementary manner. The programming is facilitated by associating on the six channel chip CH1 and CH2 with the OTP clock function, CH3 and CH4 with the OTP data function, and CH6 with the OTP control function. This will be the same regardless of whether it is a left chip or a right chip. This is further illustrated in FIG. 14 wherein the OTP 810 is illustrated as having input voltages, one received from the regulator 1237, a regulated voltage from the actual input voltage $V_{DDEXT}$ on a node 1404. This particular external voltage is also directly input to the OTP 810. The reason for this is that, during programming, the voltage must be raised to a voltage of 7.5 volts to provide programming therefor. When the voltage is raised this high, the logic state is changed, depending upon the data and this change is permanent. The OTP 810 will also receive the clocked data and the control signal. The control signal is basically a signal wherein the voltage is disposed at a $-V_C$. This is input to a comparator 1406 which comparator 1406 determines whether the voltage is at the appropriate voltage and, if so, then the control voltage indicates that the OTP 810 is active and is in the mode to be programmed.

FIG. 15 illustrates the manner by which the clock and data signal are received. This is facilitated with an Exclusive OR gate 1502 that is input to either the data or the clock input on OTP 810 such that, when the signal is the same on both of the respective pins associated with either the clock or the data signal, the respective output of the Exclusive OR output. Thus, no multiplexing function is required. Once the control function indicates that the OTP is to be programmed, as evidenced by the voltage signal on the pin associated with CH6, the programming can thus be facilitated.

Figure 16:
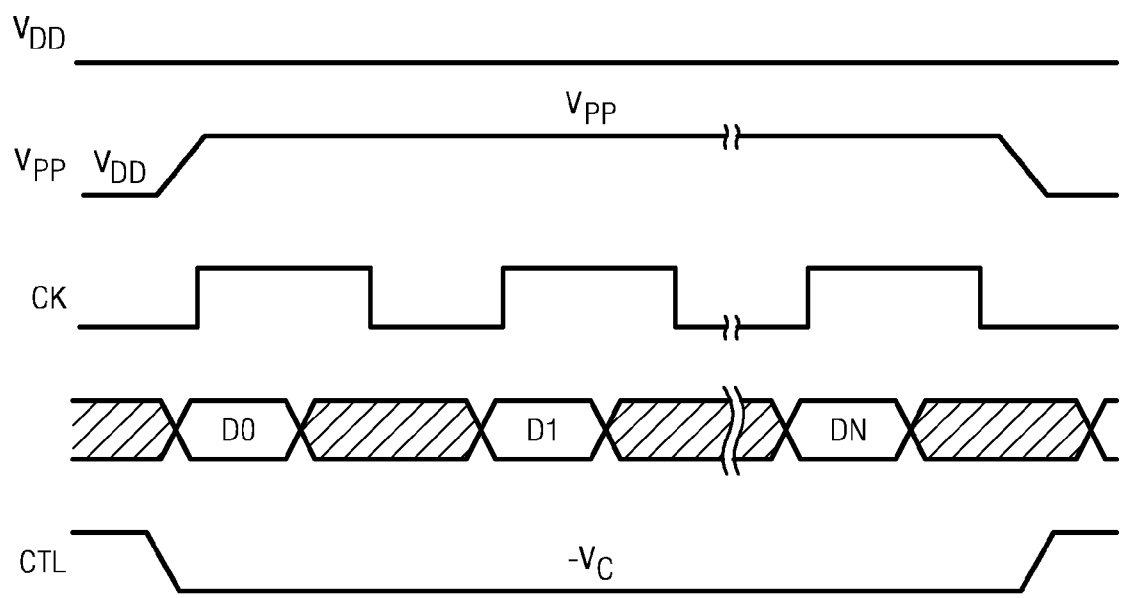
FIG. 16 illustrates a timing diagram of the OTP Write operation.

Referring now to FIG. 16, there is illustrated the timing diagram for programming the OTP which requires that $V_{PP}$ be raised high to a voltage of 7.5 volts over the normal 2.5 to 3.0 volts that $V_{DD}$ would be disposed at. $V_{DD}$ is provided to the OTP 810 to provide power thereto wherein the voltage $V_{PP}$, the external voltage, is raised higher for the programming operation. When this is high and control voltage is at $-V_C$, the OTP operation is enabled. During that time, a clock signal is utilized to clock data in. The internal OTP is one that is manufactured by Ememory Technologies Inc. which is an 8-bit input part with a 32-bit output. Thus, one 32-bit word can be programmed. This requires that there be a serial-to-parallel shift register disposed internal to the part with the clock signal clocking in 8 bits of serial data which are loaded into the shift register and then, after a counter determines that 8 bits have been serially input thereto, a Write enable is generated for the OTP and data written thereto, since $V_{PP}$ is high. Data continually serially clocks in the next 8-bits to the serial-to-parallel register (not shown) and continues until all 32 bits are written. At the end of the operation, the CTL signal is raised back to ground, indicating the end of the operation. This will then terminate the program. It should be understood that any type of OTP could be utilized and any type of programming scheme could be utilized. It could be that only a single pair of pins were utilized for the program operation.

Figure 17:
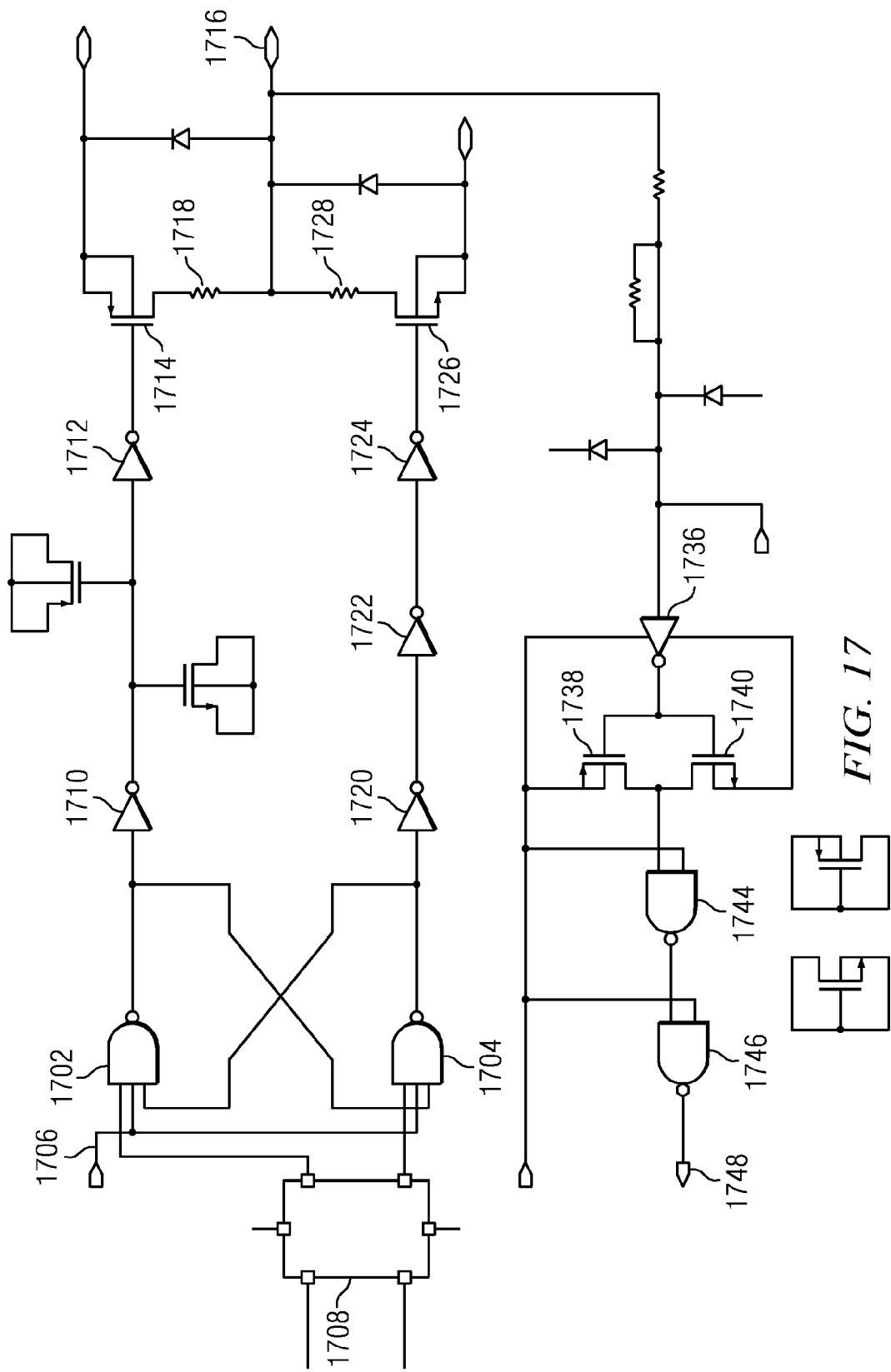
FIG. 17 illustrates a schematic diagram of the pad logic.

Referring now to FIG. 17, there is illustrated a diagrammatic view of the pad logic for a conventional pad that is not associated with the I²C operation. This is for CH2-CH3. These merely have a receiver or a transmitter. The receiver, i.e., that for receiving data from the isolation link and transmitting it to the pad is comprised of a NAND latch with two NAND gates 1702 and 1704. Each has one pin for an enable bit connected to an enable line 1706 and one input each connected to either a data-in or a data-inb signal output from a level shifter 1708. The remaining input of both of the NAND gates 1702 and 1704 are connected to the respective other output thereof to provide the cross coupled latch function. The output of NAND gate 1702 is passed through to inverters 1710 and 1712 to drive the gate of P-channel transistor 1714 which is connected between $V_{DD}$ and an output pad 1716 through a resistor 1718. Similarly, the output of NAND gate 1704 is connected through three series connected inverters 1720, 1722 and 1724 to drive the gate of an N-channel transistor 1726 connected between ground and output pad 1716 through resistor 1728. When enabled, this will provide the necessary drive for the output pad.

When configured as a receiver to drive the isolation link, the latch is disabled and the data drives an inverter 1736 which drives the gates of two series connected transistors, P-channel transistor 1738 and an N-channel transistor 1740 which constitute an inverter that drives one input of a NAND gate 1744. The output of NAND gate 1744 drives one input of a NAND gate 1746, NAND gate 1744 having the other input thereof connected to $V_{DD}$ such that it is basically an inverter. That is the same for NAND gate 1746. This provides a data output on a line 1748 for driving the transmitter.

Figure 18:
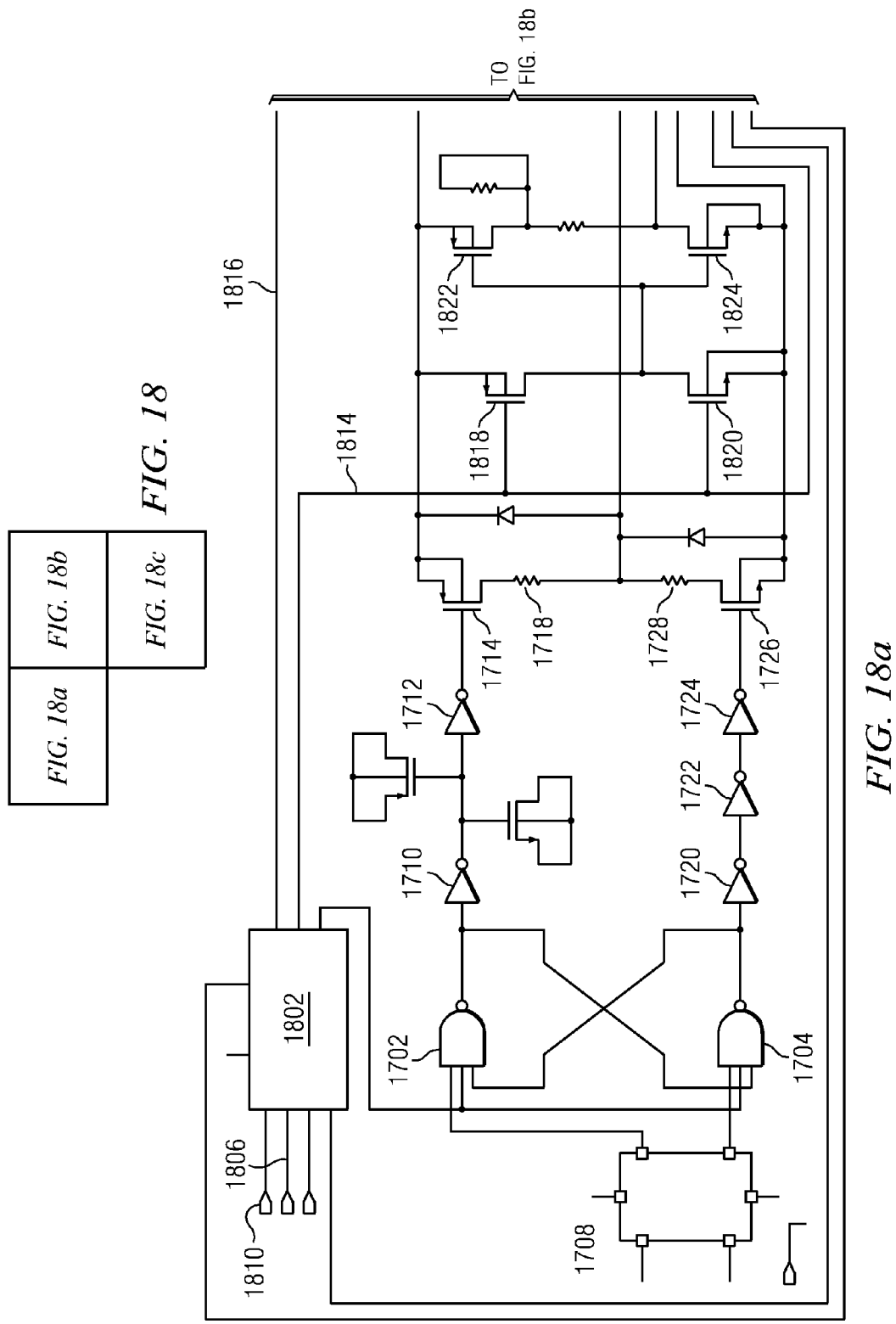
FIG. 18 illustrates a schematic diagram of the pad logic for the $I^2C$ functionality.
Figure 18B:
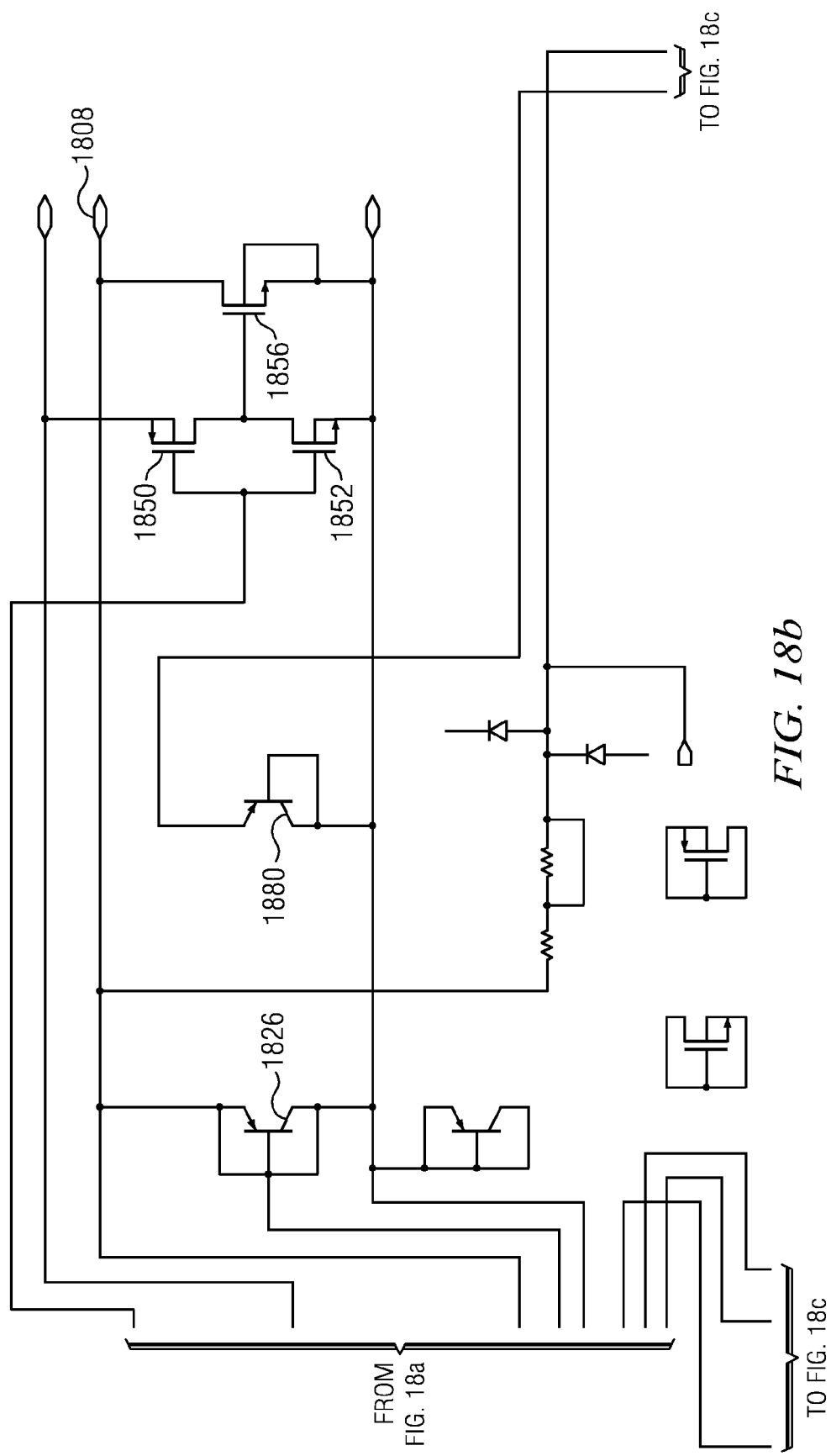
Figure 18C:
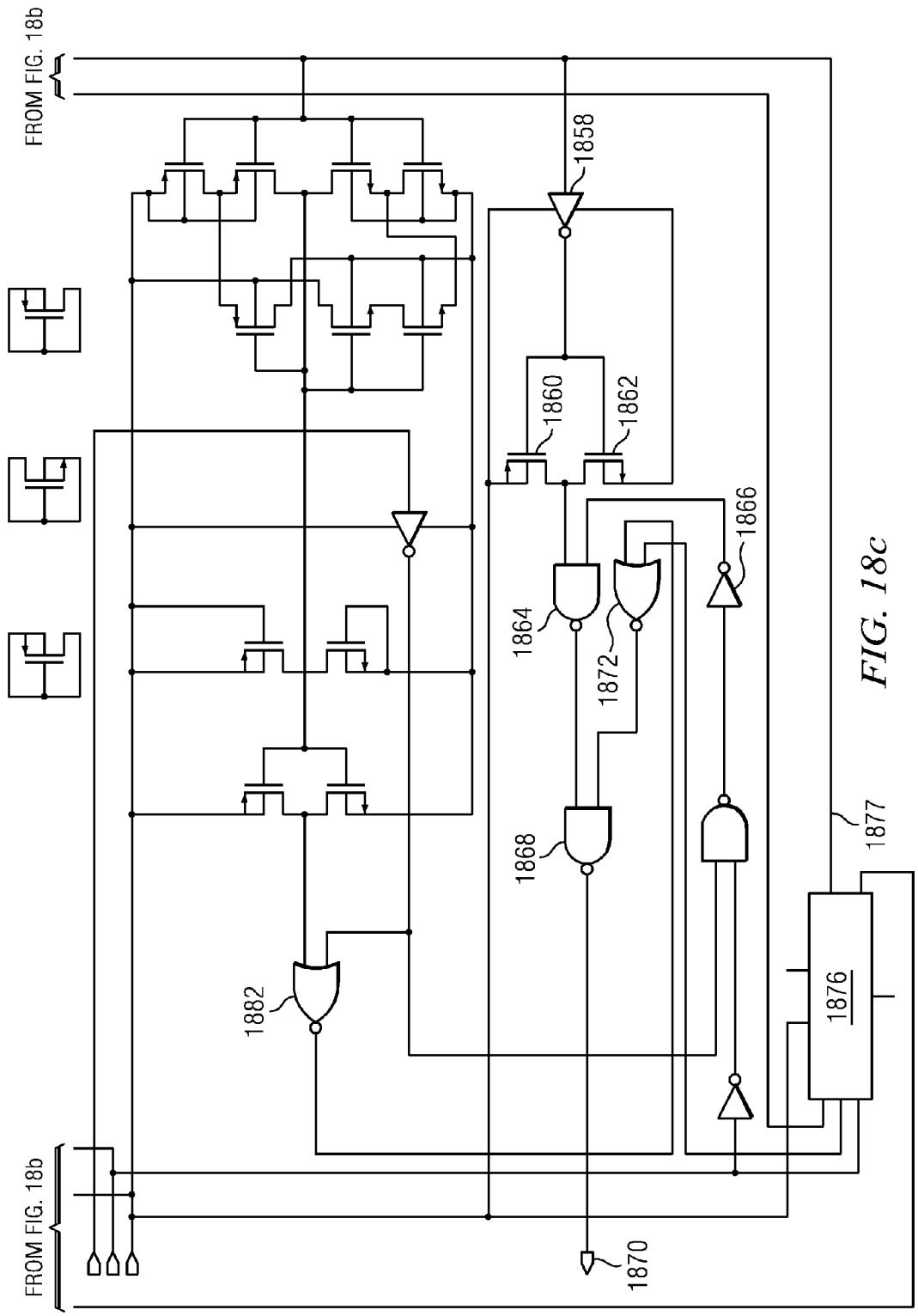

Referring now to FIG. 18, there is illustrated a diagrammatic view of the I²C pad. In general, the pad, CH0 or CH5 can be configured to be a receiver or transmitter. When configured as a receiver, or a conventional channel, it will be controlled with a control circuit 1802 to be enabled for such. The enable signal will be received on an input 1806 and this will basically provide an enable output to the general path. This general receive path to drive an output pad 1808 associated therewith will be substantially identical to that illustrated in FIG. 17 with respect to the cross coupled latch comprised of NAND gates 1702 and 1704. When the control circuit 1802 will be controlled to receive data on a line 1810 from the adjacent channel, i.e., CH1 or CH4. This data will be received and output on either a line 1814 or a line 1816, depending upon whether it is a normal I²C output or a 30 milliamp I²C output. In general, it should be understood that an I²C protocol will have an external pull up such that all that is required to do is pull down the output. Therefore, line 1814 will drive the gates of two series transistors, P-channel transistor 1818 and an N-channel transistor 1820. which coordinate as an inverter to drive the gates of a P-channel transistor 1822 and an N-channel transistor 1824 connected in series to drive the base of a P-channel pull down transistor 1826. Thus, it will be noted that for a data receive operation, i.e., data received from the isolation link, that there will be a diode drop when data is driven to the path, i.e., there will be the ability to detect whether the output line is being pulled low by the transistor 1826.

For a data receive operation, all that is required is that a detection be made as to whether the pull down is from the block 1802 or it is an external node pulling down the line. If it is detected that the output is a true ground, less than the one diode drop provided by the PNP transistor 1826, then this indicates that the data comes from other than this chip. It should be noted that when connecting the two channels that, on the left die, the path normally associated with CH0 is utilized and on the right side the pad normally associated with CH4 is utilized. In this manner, the adjacent channel will always be connected to the correct node. Also, if the output is selected by the 30 milliamp control signal on line 1816, this will drive the gates of two series connected transistors 1850 and 1852 which act as an inverter to drive an N-channel MOS transistor 1856. This does not provide the diode drop function as associated with PNP transistor 1826.

For the output function, the pad 1808 drives the input of an inverter 1858 which drives the gates of two series connected transistors 1860 and 1862 configured as an inverter to drive one input of a NAND gate 1864. The other input of the NAND gate is connected to the output of an inverter 1866. The output of gate 1864 drives one input of a NAND gate 1868, the output thereof providing the data output on a node 1870. The other input of gate 1868 is connected to the output of a NOR gate 1872, one input thereof connected to the I²C enable signal and the other input thereof connected to the output of a control block 1876 that provides the transmit control operation. This is input to the transmit data-in block which indicates that it has detected transmit data. Transmit data is detected by comparing the data value on the output line at a data line 1877, this being the voltage on node 1808. If it detects that this is lower than a diode drop, which is provided by a diode connected PNP transistor 1880 which basically provides a diode drop for comparison with the output voltage. If it is lower than this diode drop, this indicates that data has been received and provides an output to the second input of the NOR gate 1872.

The input of NOR gate 1882 is connected to pulse circuitry which is not necessarily required. In general, if data is detected, it is then routed to the data node 1870.

It will be appreciated by those skilled in the art having the benefit of this disclosure that this isolator with complementary configurable memory provides an isolator that is configured with OTP memory. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An isolator, comprising:
   first and second substantially identical circuitry galvanically isolated from each other and each having at least one communications channel thereon for communicating signals across an isolation boundary therebetween and each of said first and second circuitry having configurable functionality associated with the operation thereof;
   a coupling device coupling signal across said isolation boundary between said at least one communication channels of said first and second circuitry;
   first and second configuration memories, each associated with a respective one of said first and second circuitry;
   first and second configuration control devices, each associated with a respective one of said first and second circuitry and each configuring the functionality of the associated one of said first and second circuitry; and
   said first and second configurable memories having stored therein complementary configuration information to control each of the functionalities of said first and second circuitry to operate in a complementary manner for communication of signals across said isolation boundary.

2. The isolator of claim 1, wherein said first and second circuitry are disposed on first and second respective and substantially identical integrated circuits, each in association with said associated configuration memories and said associated configuration control devices.

3. The isolator of claim 2, and further comprising an integrated circuit package having first and second galvanically isolated sides and associated signal pins for each of said sides and for containing in each of said sides a respective one of said first and second integrated circuits and said coupling device, and said respective configuration device adaptable to interface said at least one communication channel with at least one of said signal pins to allow signal to be transmitted from one of said signal pins on one side of said isolation boundary to one of said signal pins on the opposite side thereof.

4. The isolator of claim 3, wherein each of said first and second integrated circuits are powered independently.

5. The isolator of claim 1, wherein the configurable functionality is associated with the operation of the associated communication channel.

6. The isolator of claim 1, wherein the configurable functionality is independent of the operation of the associated communication channel.

7. The isolator of claim 1, wherein each of the first and second circuitry has multiple transmission channels for coupling signals across said isolation boundary and each of said multiple communication channels on one of said first and second circuitry associated with a complementary one of said communication channels on the other of said first and second circuitry via an associated coupling device coupling signal across said isolation boundary to form a complementary pair.

8. The isolator of claim 7, wherein said configuration control device is operable to configure at least two of said complementary pairs of communication channels to provide a data path in accordance with a particular serial data protocol and interface with one of said signal pins on one side of said integrated circuit package and a complementary one of said signal pins on the other side thereof.

9. The isolator of claim 8, wherein said configuration control device is operable to configure at least another one of said complementary pair of communication channels to define a timing function for said particular serial data protocol and associated with one of said signal pins on one side of said integrated circuit package and a complementary one of said signal pins on the other side thereof to transmit timing information across said isolation boundary.

10. The isolator of claim 7, wherein said configuration control device is operable to configure at least one of said complementary pair of communication channels to define a particular serial data protocol.

11. The isolator of claim 7, wherein said first and second circuitry are disposed on first and second respective and substantially identical integrated circuits, each in association with said associated configuration memories and said associated configuration control devices, each of said first and second integrated circuits disposed in an integrated circuit package on respective first and second galvanically isolated sides thereof and said integrated circuit package having associated signal pins for each of said sides wherein, on each of said first and second integrated circuits, there is included:
   a plurality of I/O bond pads adaptable to be bonded to select ones of said associated signal pins complementary to said signal pins on the other of said sides of said integrated circuit package;
   each of said coupling devices comprised of a reactive device disposed on said associated first or second integrated circuit and interfaced with one side of the associated one of said communication channels and having a bond pad interface associated therewith and a bond wire for connection with said reactive device associated with the complementary one of said communication channels on the other of said first and second integrated circuits;
   each of said communication channels configurable to be connected on the other side thereof to a select one of said I/O bond pads;
   wherein select ones of said communication channels are configured such that a signal input on one of said signal pins on one side of said integrated circuit package is transmitted across said isolation barrier to be output on the other side thereof on the complementary one of said signal pins.

12. The isolator of claim 11, wherein said reactive device comprises a capacitor.

13. The isolator of claim 1, wherein said first and second memories are substantially identical.

14. The isolator of claim 1, where said first and second memories are programmable memories.

15. The isolator of claim 14, wherein said first and second memories are One Time Programmable (OTP) memories.

16. A method comprising:
   storing first configuration information in a first memory to configure a first communication interface to communicate over a galvanic isolation boundary;
   storing second configuration information in a second memory separate from the first memory to configure a second communication interface to communicate with the first communication interface over the isolation boundary, wherein
   the storing of the first and second configuration information is performed to configure the first and second communication interfaces to operate in a complimentary manner for communication of signals across the isolation boundary.

17. The method of claim 16, further comprising locating the first and second communication interfaces on separate integrated circuits separated by the isolation boundary.

18. The method of claim 16, further comprising adapting the first communication interface to communicate a signal from a pin associated with the first communication interface such that the signal is received by a pin associated with the second communication interface.

19. The method of claim 16, wherein storing the first configuration information comprises storing the first configuration communication in a one time programmable memory.

20. The method of claim 16, wherein storing the first information and storing the second information comprises storing the first information and the second information in substantially identical memories.

\* \* \* \* \*